(12) United States Patent
Nagasaka et al.

(10) Patent No.: US 8,488,099 B2
(45) Date of Patent: Jul. 16, 2013

(54) EXPOSURE APPARATUS AND DEVICE MANUFACTURING METHOD

(75) Inventors: Hiroyuki Nagasaka, Kumagaya (JP); Hirotaka Kohno, Ageo (JP); Yasufumi Nishii, Kumagaya (JP)

(73) Assignee: Nikon Corporation, Tokyo (JP)

(*) Notice: Subject to any disclaimer, the term of this patent is extended or adjusted under 35 U.S.C. 154(b) by 1156 days.

(21) Appl. No.: 11/578,719

(22) PCT Filed: Apr. 14, 2005

(86) PCT No.: PCT/JP2005/007261
§ 371 (c)(1), (2), (4) Date: Aug. 15, 2007

(87) PCT Pub. No.: WO2005/104195
PCT Pub. Date: Nov. 3, 2005

(65) Prior Publication Data
US 2008/0018866 A1    Jan. 24, 2008

(30) Foreign Application Priority Data

Apr. 19, 2004   (JP) ................ P2004-123253

(51) Int. Cl.
G03B 27/52    (2006.01)
G03B 27/32    (2006.01)
G03B 27/42    (2006.01)
G03B 27/54    (2006.01)

(52) U.S. Cl.
USPC ............... 355/30; 355/53; 355/55; 355/67; 355/77

(58) Field of Classification Search
USPC ............... 355/30, 53, 72–73, 77, 52, 55, 67, 355/71; 430/5, 8, 22, 311, 322; 250/492.1, 250/492.2, 492.22, 548
See application file for complete search history.

(56) References Cited

U.S. PATENT DOCUMENTS

| 4,231,768 | A | * | 11/1980 | Seibert et al. ............ 96/128 |
| 4,346,164 | A | | 8/1982 | Tabarelli et al. |
| 4,465,368 | A | | 8/1984 | Matsuura et al. |
| 4,480,910 | A | | 11/1984 | Takanashi et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

English translation of JP 2004/053955, publication of WO 2004/053955 published Jun. 24, 2004.*

(Continued)

*Primary Examiner* — Toan Ton
*Assistant Examiner* — Christina Riddle
(74) *Attorney, Agent, or Firm* — Oliff & Berridge, PLC

(57) ABSTRACT

An exposure apparatus is provided that performs well a liquid supply operation for forming a liquid immersion region and a liquid recovery operation to form a liquid immersion region in a desired state, thereby allowing high exposure accuracy and high measurement accuracy. The exposure apparatus (EX) exposes a substrate (P) by irradiating exposure light (EL) onto the substrate (P) via a liquid (LQ), and includes a liquid supply mechanism (10) that has a supply port (13) capable of supplying the liquid (LQ) substantially in parallel with a surface of the substrate (P).

27 Claims, 12 Drawing Sheets

U.S. PATENT DOCUMENTS

| | | | |
|---|---|---|---|
| 4,509,852 | A | 4/1985 | Tabarelli et al. |
| 5,493,403 | A | 2/1996 | Nishi |
| 5,528,118 | A | 6/1996 | Lee |
| 5,610,683 | A | 3/1997 | Takahashi |
| 5,623,853 | A | 4/1997 | Novak et al. |
| 5,633,698 | A | 5/1997 | Imai |
| 5,646,413 | A | 7/1997 | Nishi |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |
| 6,195,154 | B1 | 2/2001 | Imai |
| 6,400,441 | B1 | 6/2002 | Nishi et al. |
| 6,461,524 | B1* | 10/2002 | Tsuihiji et al. .................. 210/777 |
| 6,778,257 | B2 | 8/2004 | Bleeker et al. |
| 6,809,794 | B1 | 10/2004 | Sewell |
| 6,867,844 | B2* | 3/2005 | Vogel et al. ...................... 355/30 |
| 6,897,963 | B1 | 5/2005 | Taniguchi et al. |
| 6,970,228 | B1 | 11/2005 | Aoki et al. |
| 7,053,983 | B2 | 5/2006 | Tokita |
| 7,251,017 | B2 | 7/2007 | Novak et al. |
| 7,388,648 | B2 | 6/2008 | Lof et al. |
| 2002/0041377 | A1 | 4/2002 | Hagiwara et al. |
| 2002/0061469 | A1 | 5/2002 | Tanaka |
| 2004/0136494 | A1* | 7/2004 | Lof et al. ......................... 378/34 |
| 2004/0165159 | A1 | 8/2004 | Lof et al. |
| 2004/0207824 | A1* | 10/2004 | Lof et al. ......................... 355/30 |
| 2004/0263809 | A1* | 12/2004 | Nakano ............................ 355/30 |
| 2005/0007569 | A1 | 1/2005 | Streefkerk et al. |
| 2005/0073670 | A1* | 4/2005 | Carroll ............................. 355/77 |
| 2005/0112397 | A1* | 5/2005 | Rolfe et al. ..................... 428/593 |
| 2005/0136361 | A1 | 6/2005 | Endo et al. |
| 2005/0139530 | A1* | 6/2005 | Heiss ............................... 210/85 |
| 2005/0175776 | A1 | 8/2005 | Streefkerk et al. |
| 2005/0179877 | A1 | 8/2005 | Mulkens et al. |
| 2005/0233081 | A1* | 10/2005 | Tokita ........................... 427/256 |
| 2005/0259234 | A1 | 11/2005 | Hirukawa et al. |
| 2005/0280791 | A1 | 12/2005 | Nagasaka et al. |
| 2006/0038968 | A1* | 2/2006 | Kemper et al. .................. 355/18 |
| 2006/0087630 | A1 | 4/2006 | Kemper et al. |
| 2006/0152697 | A1* | 7/2006 | Poon et al. ...................... 355/53 |
| 2006/0158627 | A1 | 7/2006 | Kemper et al. |
| 2007/0109513 | A1 | 5/2007 | Leenders et al. |
| 2007/0110213 | A1 | 5/2007 | Leenders et al. |
| 2007/0222967 | A1 | 9/2007 | Poon et al. |
| 2007/0291241 | A1 | 12/2007 | Sakai et al. |
| 2008/0002169 | A1 | 1/2008 | Hasegawa et al. |
| 2008/0043211 | A1* | 2/2008 | Poon et al. ...................... 355/30 |
| 2008/0231822 | A1 | 9/2008 | Poon et al. |

FOREIGN PATENT DOCUMENTS

| | | |
|---|---|---|
| EP | 1 229 573 A1 | 8/2002 |
| EP | 1 420 298 | 5/2004 |
| EP | 1 477 856 A1 | 11/2004 |
| EP | 1 524 558 | 4/2005 |
| EP | 1 571 697 A1 | 9/2005 |
| EP | 1 571 698 A1 | 9/2005 |
| EP | 1 612 850 A1 | 1/2006 |
| EP | 1 768 169 A1 | 3/2007 |
| JP | 57-117238 | 7/1982 |
| JP | A-57-117238 | 7/1982 |
| JP | 58-202448 | 11/1983 |
| JP | 59-19912 | 2/1984 |
| JP | 62-65326 | 3/1987 |
| JP | 63-157419 | 6/1988 |
| JP | 4-65603 | 3/1992 |
| JP | A-04-065603 | 3/1992 |
| JP | 4-305915 | 10/1992 |
| JP | 4-305917 | 10/1992 |
| JP | 5-62877 | 3/1993 |
| JP | 6-53120 | 2/1994 |
| JP | A-06-53120 | 2/1994 |
| JP | 6-124873 | 5/1994 |
| JP | 6-188169 | 7/1994 |
| JP | A-06-188169 | 7/1994 |
| JP | 7-176468 | 7/1995 |
| JP | A-07-176468 | 7/1995 |
| JP | 7-220990 | 8/1995 |
| JP | 8-37149 | 2/1996 |
| JP | A-08-037149 | 2/1996 |
| JP | 8-166475 | 6/1996 |
| JP | A-08-166475 | 6/1996 |
| JP | A-08-167549 | 6/1996 |
| JP | 8-316125 | 11/1996 |
| JP | A-08-316125 | 11/1996 |
| JP | 8-330224 | 12/1996 |
| JP | A-08-330224 | 12/1996 |
| JP | 09108551 A * | 4/1997 |
| JP | A-09-108551 | 4/1997 |
| JP | 10-163099 | 6/1998 |
| JP | A-10-163099 | 6/1998 |
| JP | 10-214783 | 8/1998 |
| JP | A-10-214783 | 8/1998 |
| JP | 10-303114 | 11/1998 |
| JP | 10-340846 | 12/1998 |
| JP | 11-16816 | 1/1999 |
| JP | A-11-16816 | 1/1999 |
| JP | 11-135400 | 5/1999 |
| JP | A-11-135400 | 5/1999 |
| JP | 11-176727 | 7/1999 |
| JP | 2000-58436 | 2/2000 |
| JP | A-2000-505958 | 5/2000 |
| JP | 2000-164504 | 6/2000 |
| JP | A-2000-164504 | 6/2000 |
| JP | 2002-14005 | 1/2002 |
| JP | A-2002-14005 | 1/2002 |
| JP | 2004-228497 | 8/2004 |
| JP | A-2004-228497 | 8/2004 |
| JP | A-2005-12228 | 1/2005 |
| JP | A-2005-20013 | 1/2005 |
| JP | 2005-64210 | 3/2005 |
| JP | A-2005-64210 | 3/2005 |
| JP | 2005-123305 | 5/2005 |
| JP | 2005-136404 | 5/2005 |
| JP | A-2005-123305 | 5/2005 |
| JP | A-2005-136404 | 5/2005 |
| JP | 2005-175176 | 6/2005 |
| JP | A-2005-150734 | 6/2005 |
| JP | A-2005-175176 | 6/2005 |
| JP | 2005-183523 | 7/2005 |
| JP | A-2005-183523 | 7/2005 |
| WO | WO 98/28665 | 7/1998 |
| WO | 99/49504 | 9/1999 |
| WO | WO 99/49504 | 9/1999 |
| WO | WO 01/06548 A1 | 1/2001 |
| WO | WO 01/35168 | 5/2001 |
| WO | 2004/019128 | 3/2004 |
| WO | WO 2004/053955 A1 | 6/2004 |
| WO | WO 2004053955 A1 * | 6/2004 |
| WO | WO 2004/055803 | 7/2004 |
| WO | WO 2004/057589 | 7/2004 |
| WO | WO 2004/057590 | 7/2004 |
| WO | WO 2004/090634 | 10/2004 |
| WO | WO 2004/092833 | 10/2004 |
| WO | WO 2005/024517 | 3/2005 |
| WO | WO 2007/046523 A1 | 4/2007 |

OTHER PUBLICATIONS

European Search Report issued Jul. 28, 2009 for corresponding European Patent Application No. EP 05 73 0580.

PCT International Search Report, dated Jul. 26, 2005, and issued in related International Application No. PCT/JP2005/007261.

Refraction Technologies Corp. Product Literature: Porous Ceramics and Specifications.

Jul. 27, 2010 Office Action issued in Japanese Patent Application No. 2006-512512, with translation.

Jul. 10, 2012 Office Action issued in Japanese Patent Application No. 2010-215955, with translation.

Oct. 2, 2012 Office Action issued in Japanese Patent Application No. 2010-215955, with translation.

Mar. 7, 2011 Office Action issued in European Patent Application No. 05730580.7.
May 27, 2011 Office Action issued in Korean Patent Application No. 10-2006-7021627, with translation.
Jul. 26, 2005 Written Opinion issued in International Patent Application No. PCT/JP2005/007261, with translation.

Sep. 17, 2008 Office Action issued in U.S. Appl. No. 11/987,788.
Apr. 7, 2009 Notice of Allowance issued in U.S. Appl. No. 11/987,788.

* cited by examiner

EXPOSURE APPARATUS AND DEVICE MANUFACTURING METHOD

TECHNICAL FIELD

The present invention relates to an exposure apparatus that exposes a substrate by irradiating exposure light via a liquid and to a device manufacturing method.

Priority is claimed on Japanese Patent Application No. 2004-123253, filed on Apr. 19, 2004, the content of which is incorporated herein by reference.

BACKGROUND ART

Semiconductor devices and liquid crystal display devices are manufactured through what is known as photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern, via a projection optical system, onto the substrate. In recent years, there has been demand for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the current mainstream exposure wavelength is 248 nm of KrF excimer laser, but an even shorter wavelength of 193 nm of ArF excimer laser is now gradually being put to practical use.

In addition, as well as resolution, the depth of focus (DOF) is also important when performing an exposure. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ is made shorter and the numerical aperture NA is made larger, then the depth of focus δ becomes narrower.

When the depth of focus δ becomes too narrow, it becomes difficult to make the substrate surface coincide with the image plane of the projection optical system, and thus there is the possibility that the focus margin during the exposure operation will be insufficient. To address this problem, the liquid immersion method, which is disclosed in, e.g., Patent Document 1 below, has been proposed as a method to make the exposure wavelength substantially shorter and to make the depth of focus substantially broader. This liquid immersion method is designed, by filling the space between the bottom surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

Patent Document 1: PCT International Publication No. WO99/49504

To perform a liquid immersion exposure processing and/or various optical measurement processings via a liquid with good accuracy, it is important to perform a liquid supply operation and a liquid recovery operation for forming a liquid immersion region and thus to form the liquid immersion region in a desired state. For example, if a liquid supplied for forming a liquid immersion region exerts a force on the substrate and/or the substrate stage, there is a possibility that the substrate and/or the substrate stage may undergo a slight deformation and/or vibration due to the force, which deteriorates exposure accuracy and/or measurement accuracy.

In addition, there is a high possibility that a gas portion such as a bubble may be generated in the liquid in the liquid immersion region when a liquid supply operation is started for forming the liquid immersion region. A gas portion, once generated, leads to phenomena such as: exposure light for forming a pattern image onto the substrate not reaching the substrate; exposure light for forming a pattern image onto the substrate not reaching the desired position; measurement light not reaching the measurement apparatus; or measurement light not reaching the desired position. This brings about the deterioration of exposure accuracy and measurement accuracy.

In addition, there is a possibility that, if vibration occurs at the time of liquid recovery, the vibration may deteriorate exposure accuracy and/or measurement accuracy.

DISCLOSURE OF INVENTION

The present invention has been achieved in view of such circumstances, and has an object to provide an exposure apparatus in which a liquid supply operation and a liquid recovery operation for forming a liquid immersion region perform well in forming the liquid immersion region in a desired state, allowing a high exposure accuracy and a high measurement accuracy to be obtained, and to provide a device manufacturing method using the exposure apparatus.

To solve the above-described problems, the present invention adopts the following configurations.

An exposure apparatus of the present invention is an exposure apparatus that exposes a substrate by irradiating exposure light onto the substrate via a projection optical system and a liquid, including a liquid supply mechanism that has a supply port from which the liquid flows substantially in parallel with a surface of the substrate located on an image plane side of the projection optical system and that supplies the liquid to the image plane side of the projection optical system.

According to the present invention, since the liquid supply mechanism causes the liquid to flow from the supply port substantially in parallel with the surface of the substrate, the force of the supplied liquid exerted on the substrate can be suppressed. Therefore, disadvantages can be prevented such as deformation of the substrate and/or the substrate stage due to the supplied liquid. Therefore, high exposure accuracy and high measurement accuracy can be obtained.

An exposure apparatus of the present invention is an exposure apparatus that exposes a substrate by irradiating exposure light onto the substrate via a projection optical system and a liquid, comprising: a first surface that includes an end surface of the projection optical system and that comes into contact with the liquid; and a second surface that is provided so as to surround the first surface and that comes into contact with the liquid, wherein the first surface and the second surface are arranged such that a distance between a surface of an object located on the image plane side of the projection optical system and the first surface is longer than a distance between the surface of the object and the second surface, and wherein a contact angle of the liquid on the first surface is smaller than a contact angle of the liquid on the second surface.

According to the present invention, when a liquid supply is started to the end surface side of the projection optical system, the supplied liquid wets and spreads over the first surface including the end surface of the projection optical system so as to cover it and then wets and spreads over the second surface. This is because the contact angle of the liquid on the first surface is smaller than the contact angle of the liquid on the second surface even though the distance between the first surface including the end surface of the projection optical system and the surface of the object is longer than the distance between the second surface and the surface of the object.

Therefore, the disadvantage of generation of a gas portion (bubble) in the liquid immersion region, at least between the end surface of the projection optical system and the object, i.e., in the optical path of the exposure light can be prevented, and a liquid immersion region without a gas portion (bubble) can be formed speedily. Therefore, the throughput can be increased, and high exposure accuracy and high measurement accuracy can be obtained.

An exposure apparatus of the present invention is an exposure apparatus that exposes a substrate by irradiating exposure light onto the substrate via a projection optical system and a liquid, comprising: a liquid supply mechanism that supplies the liquid to the image plane side of the projection optical system; a first surface that includes an end surface of the projection optical system and that comes into contact with the liquid; and a second surface that is provided so as to surround the first surface and that comes into contact with the liquid, wherein the first surface and the second surface are respectively arranged so as to form a gap with respect to a surface of the substrate located on the image plane side of the projection optical system, and wherein the liquid supply mechanism has a supply port of the liquid between the first surface and the second surface.

According to the present invention, the disadvantage of generation of a gas portion, such as a bubble, in the optical path of the exposure light can be prevented, and high exposure accuracy and high measurement accuracy can be obtained.

An exposure apparatus of the present invention is an exposure apparatus that exposes a substrate by irradiating exposure light onto the substrate via a projection optical system and a liquid, including a liquid recovery mechanism that has a recovery port for recovering the liquid on the image plane side of the projection optical system, a plurality of porous members having a plurality of pores formed therein provided in a stack over the recovery port.

According to the present invention, since a plurality of porous members are provided over the recovery port, the size of a liquid drop that is recovered via the recovery port and has passed through the porous members can be reduced. Therefore, vibration component occurring at the time of liquid recovery and affecting exposure accuracy and/or measurement accuracy can be suppressed. Furthermore, providing the plurality of porous members in a stack can maintain the strength of the porous members. Therefore, deformation of and/or damage to the porous members can be prevented even if pressure difference occurs between the top surface and the bottom surface of the porous members at the time of liquid recovery.

In addition, an exposure apparatus of the present invention is an exposure apparatus that exposes a substrate by irradiating exposure light onto the substrate via a liquid, comprising: a liquid supply mechanism that has a supply port capable of supplying a liquid, above an object, substantially in parallel with a surface of the object; and a liquid recovery mechanism having a recovery port that is provided at a position more distant than a supply port with respect to the optical path of the exposure light and that is capable of recovering a liquid on the object from above the object.

According to the present invention, since the liquid supply mechanism supplies the liquid from the supply port substantially in parallel with the surface of the substrate, the force of the supplied liquid exerted on the object can be suppressed. Therefore, high exposure accuracy and high measurement accuracy can be obtained.

A device manufacturing method of the present invention is characterized by using the above-described exposure apparatus.

According to the present invention, since the liquid immersion region can be suitably formed to obtain high exposure accuracy and high measurement accuracy, a device with a desired performance can be manufactured.

According to the present invention, a liquid supply operation and a liquid recovery operation for forming a liquid immersion region can be well performed to form the liquid immersion region in a desired state, allowing high exposure accuracy and high measurement accuracy.

BEST MODE FOR CARRYING OUT THE INVENTION

Figure 1:
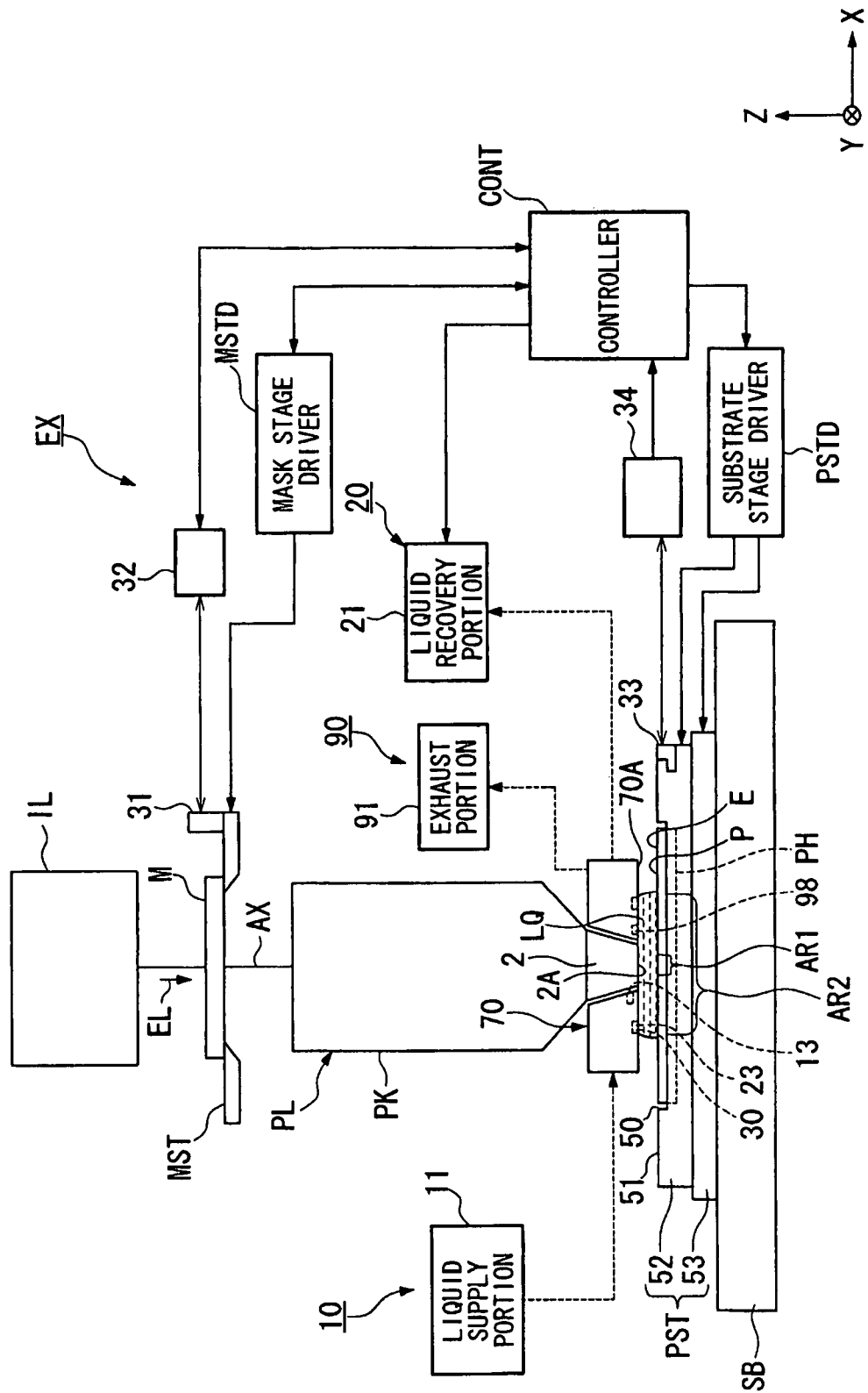
FIG. 1 is a schematic block diagram showing an embodiment of an exposure apparatus of the present invention.

In the following, an exposure apparatus of the present invention will be described with reference to the drawings. FIG. 1 is a schematic block diagram showing an embodiment of an exposure apparatus of the present invention.

In FIG. 1, the exposure apparatus EX includes: a mask stage MST that supports a mask M; a substrate stage PST that supports a substrate P; an illumination optical system IL that illuminates the mask M supported by the mask stage MST with an exposure light EL; a projection optical system PL that projection-exposes a pattern image of the mask M illuminated with the exposure light EL onto the substrate P supported by the substrate stage PST; and a controller CONT that controls the overall operation of the exposure apparatus EX.

The exposure apparatus EX of this embodiment is a liquid immersion exposure apparatus, to which a liquid immersion method is applied, with the exposure wavelength being substantially shortened, to improve the resolution and to substantially widen the depth of focus, and includes a liquid supply mechanism 10 that supplies the liquid LQ onto the substrate P and a liquid recovery mechanism 20 that recovers the liquid LQ on the substrate P. The exposure apparatus EX, at least while transferring the pattern image of the mask M onto the substrate P, forms, by using the liquid LQ supplied from the liquid supply mechanism 10, a liquid immersion region AR2 locally on a part of the substrate P including the projection region AR1 of the projection optical system PL such that the liquid immersion region A2 is larger than a projection region AR1 and smaller than the substrate P. More specifically, the exposure apparatus EX adopts a local liquid immersion method in which the space between an optical element 2 disposed at the image plane side end of the projection optical system PL and the surface of substrate P located on the image plane side is filled with the liquid LQ, and by irradiating the exposure light EL having passed through the mask M onto the substrate P via the liquid LQ between the projection optical system PL and the substrate P as well as the projection optical system PL, projection-exposes the pattern of the mask M onto the substrate P.

In addition, in the vicinity of the optical element 2 at the end portion of the projection optical system PL is provided a nozzle member 70 which will be described later in detail. The nozzle member 70 is an annular member provided so as to surround, above the substrate P (substrate stage PST), the optical element 2. In this embodiment, the nozzle member 70 constitutes a respective part of the liquid supply mechanism 10 and the liquid recovery mechanism 20. In the nozzle member 70 is provided a supply port 13 from which the liquid LQ flows substantially in parallel with the surface of the substrate P supported by the substrate stage PST. Moreover, in the nozzle member 70, a recovery port 23 over which porous members 30 are disposed and which recovers the liquid LQ via the porous members 30 is provided. In addition, the exposure apparatus EX includes an exhaust mechanism 90 with a suction port 98 provided on the image plane side of the projection optical system PL, more specifically, on the nozzle member 70.

It is to be noted that in the following, a description will be made of the case where the nozzle member 70 and the substrate P face each other, by way of example, but the same is true of the case where an object other than the substrate P (e.g., a top surface of the substrate stage PST, etc.) faces the nozzle member 70.

The present embodiment will be described assuming, as an example, the case where as the exposure apparatus EX, a scan type exposure apparatus (the so-called scanning stepper) in which while synchronously moving the mask M and the substrate P in mutually different directions (opposite directions) along the scanning directions, the pattern formed on the mask M is exposed onto substrate P is used. In the following description, it is assumed that the direction that coincides with an optical axis AX of the projection optical system PL is referred to as the Z-axis direction, that the synchronous movement direction (the scanning direction), in a plane perpendicular to the Z-axis direction, of the mask M and the substrate P is referred to as the X-axis direction, and that the direction perpendicular to the Z-direction and to the X-direction is referred to as the Y-direction (the non-scanning direction). In addition, the rotation (tilting) directions around the X-axis, Y-axis and Z-axis are the θX, θY and θZ directions respectively.

The illumination optical system IL is for illuminating the mask M supported by the mask stage MST with the exposure light EL and includes an exposure light source, an optical integrator for making the illuminance of a light flux emitted from the exposure light source uniform, a condenser lens for condensing the exposure light EL from the optical integrator, a relay lens system, a variable field stop for setting an illumination area on the mask M formed by the exposure light EL to be of a slit-like shape, etc. A specified illumination area on the mask M is illuminated by the illumination optical system IL with the exposure light EL having a uniform illuminance distribution. As the exposure light EL emitted from the illumination optical system IL, for example, a bright line of the ultraviolet region (g line, h line, i line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ laser light (wavelength of 157 nm) may be used. In this embodiment, an ArF excimer laser light is used.

In this embodiment, purified water is used as the liquid LQ. Purified water can transmit not only an ArF excimer laser light but also, for example, a bright line of the ultraviolet region (g line, h line, or i line) emitted from a mercury lamp and a deep ultraviolet light (DUV light) such as a KrF excimer laser light (wavelength of 248 nm).

The mask stage MST is movable while holding the mask M and fixes the mask M by, for example, vacuum adsorption (or electrostatic adsorption). The mask stage MST, driven by a mask stage driver MSTD including, e.g., a linear motor, is two-dimensionally movable in a plane perpendicular to the optical axis AX of the projection optical system PL, i.e., in the XY-plane, and is finely rotatable in the θZ direction. Furthermore, the mask stage MST is movable in the X-axis direction at a designated scanning speed and has a moving stroke in the X-axis direction long enough to allow the entire surface of the mask M to transverse at least the optical axis AX of the projection optical system PL.

A moving mirror 31 is provided on the mask stage MST. In addition, a laser interferometer 32 is provided at a position facing the moving mirror 31. The two-dimensional position and the rotation angle in the θZ direction (including rotation angles in the θX and θY directions, as the case may be) of the mask M on the mask stage MST are measured by the laser interferometer 32 in real time, and the measurement results are outputted to the controller CONT. By driving the mask stage driver MSTD based on the measurement results from the laser interferometer 32, the controller CONT controls the position of the mask M supported by the mask stage MST.

The projection optical system PL is for projection-exposing the pattern of the mask M onto the substrate P at a predetermined projection magnification of β and is constituted by a plurality of optical elements, including an optical element (lens) 2 disposed at the end portion on the substrate P side, and those optical elements 2 are supported by a lens barrel PK. In this embodiment, the projection optical system PL is a reduction system of which projection magnification β is, e.g., ¼ or ⅕. It should be noted that the projection optical system PL may also be either a unit magnification system or a magnifying system. In addition, the projection optical system PL may be any of a refractive system without a reflective optical element, a reflective system without a refractive optical element, and a reflective/refractive system with a reflective element and a refractive element.

The optical element 2 at the end portion of the projection optical system PL of this embodiment is exposed from the lens barrel PK and comes into contact with the liquid LQ in the liquid immersion region AR2. The optical element 2 is made of calcium fluorite. Since the surface of calcium fluorite has a high affinity for water, the liquid LQ can be made to be in tight contact with substantially the entire surface of a liquid contact surface (end surface) 2A of the optical element 2. More specifically, since, in this embodiment, it is configured such that the liquid (water) LQ having a high affinity for the liquid contact surface 2A of the optical element 2 is supplied, the contact degree between the liquid contact surface 2A of the optical element 2 and the liquid LQ is high, so that the optical path between the optical element 2 and the substrate P can be assuredly filled with the liquid LQ. It should be noted that the optical element 2 may be made of silica glass, which has a high affinity for water. In addition, the liquid contact surface 2A of the optical element 2 may be subjected to hydrophilic (lyophilic) treatment, such as attaching $MgF_2$, $Al_2O_3$, $SiO_2$, etc., to enhance the affinity for the liquid LQ. Alternatively, since the liquid LQ of this embodiment is water having a large polarity, by forming a thin film with a substance with a molecular structure having a large polarity, e.g., alcohol, as hydrophilic treatment (lyophilic treatment), hydrophilicity is given to the liquid contact surface 2A of the optical element 2. More specifically, when water is used as the liquid LQ, a treatment in which a substance with a molecular structure having a large polarity, e.g., an OH group, is disposed on the liquid contact surface 2A is desirable. In any case, the end surface 2A of the optical element 2 of this embodiment has a contact angle of 5 to 20 degrees with respect to the liquid LQ.

The substrate stage PST is movable while holding the substrate P, and is constituted by including an XY stage 53 and a Z tilt stage 52 mounted on the XY stage 53. The XY stage 53 is non-contact-supported above the top surface of a stage base SB via a gas bearing (air bearing), which is a non-contact bearing, not shown. The XY stage 53 (substrate stage PST), driven by a substrate stage driver PSTD including a linear motor, etc., is two-dimensionally movable in a plane perpendicular to the optical axis AX of the projection optical system PL, i.e., in the XY-plane, and is finely rotatable in the θZ direction, while being non-contact-supported with respect to the top surface of the stage base SB. The Z tilt stage 52 is mounted on this XY stage. The Z tilt stage 52 is provided so as to be movable also in the Z-axis, θX, and θY directions. The substrate stage driver PSTD is controlled by the controller CONT. The substrate P is held on the Z tilt stage 52 via a substrate holder PH by vacuum adsorption, etc.

On the Z tilt stage 52, a recess portion 50 is provided, and the substrate holder PH for holding the substrate P is provided in the recess portion 50. Furthermore, the top surface 51 of the Z tilt stage 52 other than the recess portion 50 is a flat surface (flat portion) such that it is substantially as high as (flush with) the surface of the substrate P held by the substrate holder PH. Since the top surface 51 substantially flush with the surface of the substrate P is provided around the substrate P, there is substantially no height difference outside an edge portion E of the substrate P, even when the edge portion is liquid-immersion-exposed. Therefore, the liquid immersion region AR2 can be suitably formed with the liquid LQ being held or retained on the image plane side of the projection optical system PL. In addition, although there is a gap of about 0.1 to 2 mm between the edge portion of the substrate P and the flat surface (top surface) 51 provided around the substrate P, almost no liquid LQ flows into the gap due to the surface tension of the liquid LQ; the liquid LQ can be held under the projection optical system PL by the top surface 51, also when the area in the vicinity of the periphery of the substrate P is exposed. It should be noted that there may be a height difference between the surface of the substrate P and the top surface 51 of the Z tilt stage 52 as long as the liquid LQ can be held under the projection optical system PL.

In addition, flowing-out of the liquid LQ to the outside of the substrate P (the outside of the top surface 51) during liquid immersion exposure can be suppressed by making the top surface 51 liquid-repellent (a contact angle of 90 to 130 degrees with respect to the liquid LQ). In addition, even after the liquid immersion exposure, the liquid LQ can be smoothly recovered, preventing a disadvantage that the liquid LQ remains on the top surface 51. The top surface 51 can be made liquid-repellent by forming the top surface 51 of the Z tilt stage 52 out of a material with a liquid-repellency such as polytetrafluoroethylene (Teflon®). Alternatively, the top surface 51 may be subjected to liquid-repellent treatment including: application of a fluoroplastic material such as polytetrafluoroethylene, an acrylic plastic material, and a silicon plastic material; or attachment of a thin film made of the above-mentioned liquid-repellent material. In addition, a film for liquid-repellent treatment (surface treatment) may be a single layer film or a film made of multiple layers. As a liquid-repellent material for realizing the liquid-repellency, a material nonsoluble in the liquid LQ is used. In addition, a region to be applied with the liquid-repellent material (liquid-repellent treatment region) may be an entire region of the top surface 51 or only a part that needs liquid-repellency.

A moving mirror is provided on the substrate stage PST (Z tilt stage 52). In addition, an interferometer 34 is provided at a position facing the moving mirror 33. In this embodiment, the top surface of the moving mirror 33 is provided also so as to be substantially flush with the top surface of the top surface 51 of the Z tilt stage 52. The two-dimensional position and the rotation angle of the substrate P on the substrate stage PST are measured by the laser interferometer 34 in real time, and the measurement results are outputted to the controller CONT. By driving the substrate stage driver PSTD based on the measurement results from the laser interferometer 34, the controller CONT performs positioning of the substrate P supported by the substrate stage PST.

In addition, the exposure apparatus EX includes a later-described focus/leveling detection system (80) that detects the position of the surface of the substrate P supported by the substrate stage PST (substrate holder PH). The measurement results from the focus/leveling detection system are outputted to the controller CONT. The controller CONT can detect the position information of the surface of the substrate P in the Z-axis direction and the tilt information of the substrate P in the θX and θY directions based on the detection results from the focus/leveling detection system. The Z tilt stage 52, by controlling the focus position and tilt angle of the substrate P, makes the surface of the substrate P to coincide with the image plane of the projection optical system PL. The XY stage 53 performs positioning of substrate P in the X-axis and Y-axis directions. It is to be noted that needless to say, the Z tilt stage and the XY stage may be integrally provided.

Figure 2:
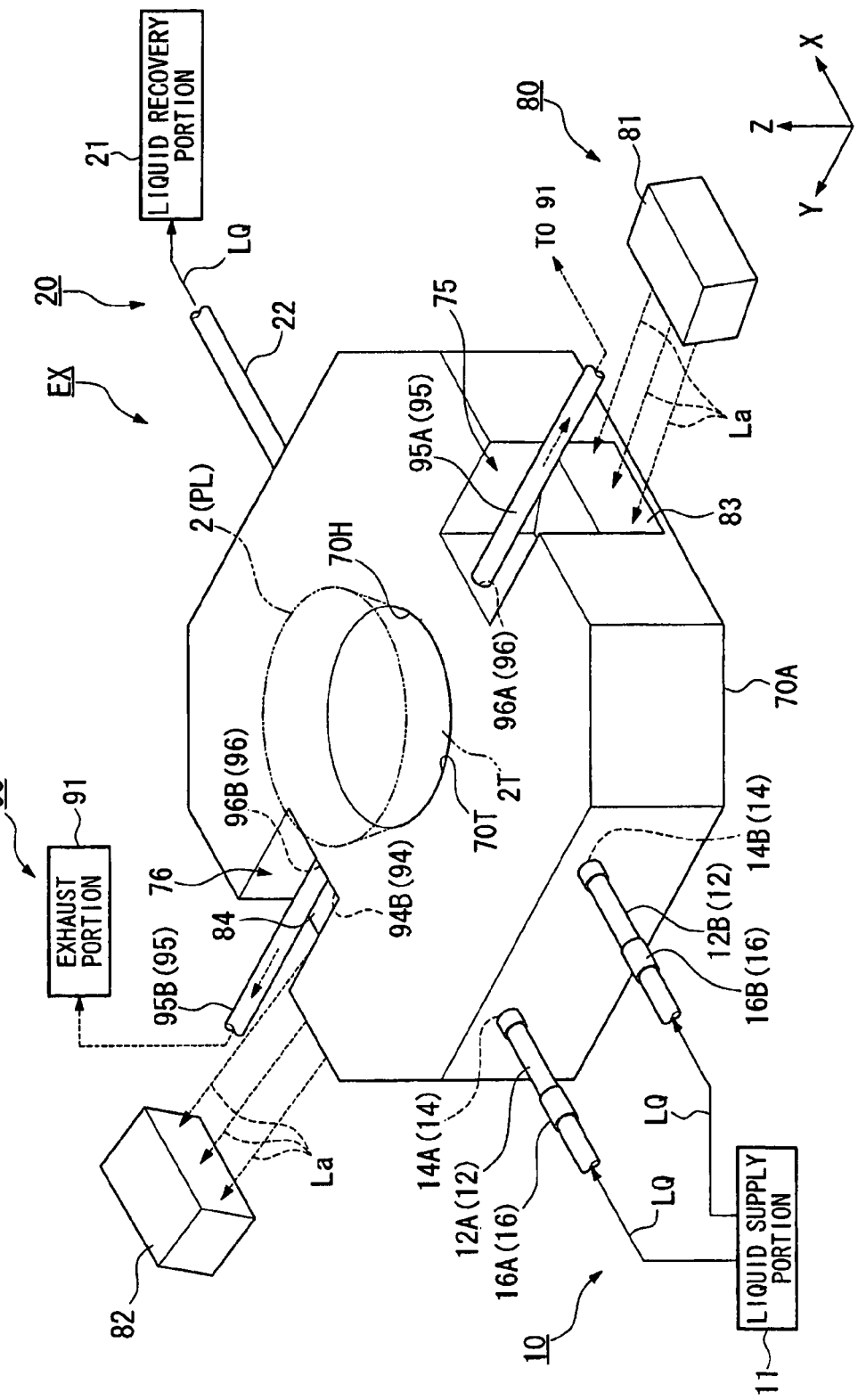
FIG. 2 is a perspective view showing a nozzle member according to the present invention.
Figure 3:
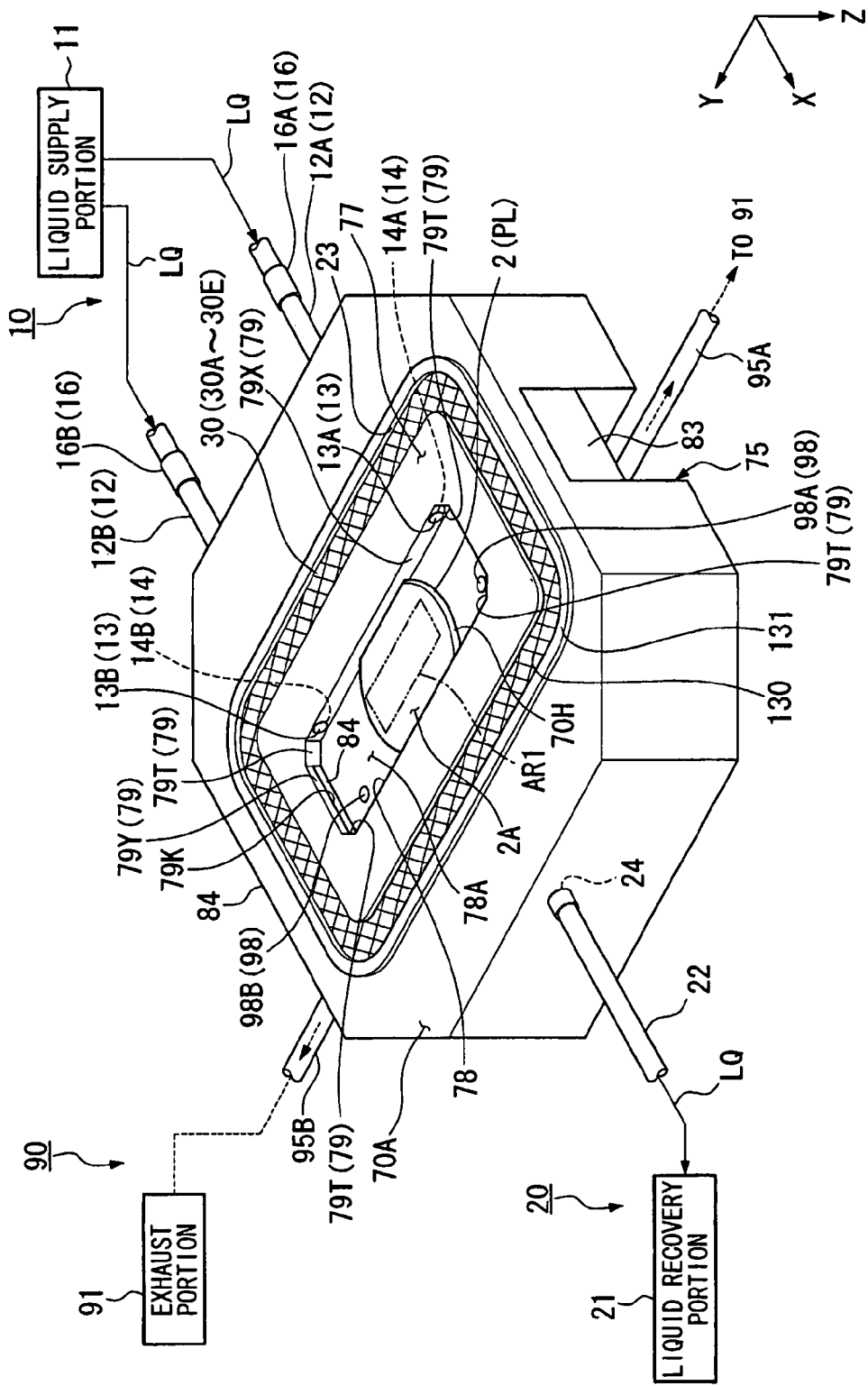
FIG. 3 is a perspective view of the nozzle member seen from the bottom surface side.

Next, a description of the liquid supply mechanism 10, the liquid recovery mechanism 20, and the nozzle member 70 will be described with reference to FIG. 2 and FIG. 3. FIG. 2 is a schematic perspective view showing a vicinity of the nozzle member 70. FIG. 3 is a perspective view of the nozzle member 70 seen from the bottom surface 70A side.

The nozzle member 70 is an annular member that is provided in the vicinity of the optical element 2 at the end portion of the projection optical system PL and that is provided so as to surround, above the substrate P (substrate stage PST), the optical element 2. The nozzle member 70 has, in the center portion thereof, a hole portion 70H capable of placing the projection optical system PL (optical element 2). The nozzle member 70 can be formed of, for example, aluminum, titanium, stainless steel, duralumin, or an alloy including these. Alternatively, the nozzle member 70 may be constituted by a transparent member (optical member) that has light transmittance, such as glass (silica glass).

The liquid supply mechanism 10 is for supplying the liquid LQ onto the image plane side of the projection optical system PL, and includes: a liquid supply portion 11 that can deliver the liquid LQ; supply pipes 12 (12A, 12B) one end of which is connected to the liquid supply portion 11 and the other end of which is respectively connected to one end of supply channels 14 (14A, 14B) formed inside the nozzle member 70; and supply ports 13 (13A and 13B) that are formed in the nozzle member 70, that are respectively connected to the other end of the supply channels 14 (14A, 14B), and from that the liquid LQ flows substantially in parallel with the surface of the substrate P located on the image plane side of the projection optical system PL, i.e., substantially in parallel with the XY-plane. The liquid supply portion 11 includes a tank that stores the liquid LQ, a temperature-adjusting apparatus that adjusts the temperature of the liquid LQ to be supplied, a filter apparatus that removes foreign matter in the liquid LQ, a pressurizing pump, etc. When forming the liquid immersion region AR2 on the substrate P, the liquid supply mechanism 10 supplies the liquid LQ from the supply ports 13 (13A and 13B) formed in the nozzle member 70 to the space between the optical element 2 on the image plane side of the projection optical system PL and the substrate P located on the image plane side thereof. It is to be noted that the exposure apparatus EX need not include all of the tank, temperature-adjusting apparatus, filter apparatus, pressurizing pump, etc. but at least some of them may be substituted by facilities in a plant where the exposure apparatus is to be installed.

The liquid recovery mechanism 20 is for recovering the liquid LQ on the image plane side of the projection optical system PL, and includes a liquid recovery portion 21 that can recover the liquid LQ, a recovery pipe 22 one end of which is connected to the liquid recovery portion 21 and the other end of which is connected to one end of a recovery channel 24 formed inside the nozzle member 70, and a recovery port 23 that is formed in the nozzle member 70 and is connected to the other end of the recovery channel 24. The liquid recovery portion 21 includes, for example, a vacuum system (suction apparatus) such as a vacuum pump, a gas-liquid separator that separates the gas from the recovered liquid LQ, a tank that stores the recovered liquid LQ, etc. It should be noted that as the vacuum system, at least one of the vacuum system such as a vacuum pump, the gas-liquid separator, and the tank may be substituted by facilities in a plant where the exposure apparatus is to be installed instead of providing them in the exposure apparatus EX. The liquid recovery mechanism 20 recovers a predetermined amount of the liquid LQ supplied from the liquid supply mechanism 10 via the recovery port 23 formed in the nozzle member 70 such that the liquid immersion region AR2 is formed in a predetermined space on the image plane side of the projection optical system PL. A gap is provided between an inner side surface 70T of the hole portion 70H of the nozzle member 70 and a side surface 2T of the optical element 2 of the projection optical system PL. The gap is provided for vibrationally isolating the optical element 2 of the projection optical system PL from the nozzle member 70. In addition, the liquid supply mechanism 10 and the liquid recovery mechanism 20 including the nozzle member 70 are supported by a support system different from a support system that supports the projection optical system PL, and thus the liquid supply mechanism 10 and the liquid recovery mechanism 20 are vibrationally separated from the projection optical system PL. By this, vibration generated in the liquid supply mechanism 10 and the liquid recovery mechanism 20 including the nozzle member 70 is prevented from transmitting to the projection optical system side. In addition, in the gap between the inner side surface 70T of the nozzle member 70 and the side surface 2T of the optical element 2, a sealing member (packing) such as a V-ring or an O-ring formed of a material with little elution of metal ions is provided. Therefore, this prevents not only leakage of the liquid LQ forming the liquid immersion region AR2 from the gap but also mixing of a gas (bubble) from the gap into the liquid LQ forming the liquid immersion region AR2.

As shown in FIG. 3, on an bottom surface 70A of the nozzle member 70 facing the substrate P, a recess portion 78 is formed with the Y-axis direction as the longitudinal direction. The recess portion 78 has an inner side surface 79 (79X, 79Y). The inner side surface 79 is provided so as to be substantially orthogonal to the surface of the substrate P supported by the substrate stage PST. Here, the substrate stage PST supports the substrate P such that the surface of the substrate P and the XY-plane are substantially parallel with each other. Furthermore, the inner side surface 79 has: inner side surfaces 79X that are provided substantially in parallel with the YZ-plane such that they face in the +X direction and −X direction, respectively; and inner side surfaces 79Y that are provided substantially in parallel with the XZ-plane such that they face in the +Y direction and −Y direction, respectively. Moreover, the inner side surface 79 has tilt surfaces (taper surfaces) 79T that connect the inner side surfaces 79X and the inner side surfaces 79Y. Thus, the recess portion 78 forms, in the bottom surface 70A of the nozzle member 70, a wall portion having the inner side surface 79 substantially parallel with the surface of the substrate P.

The supply ports 13 (13A and 13B) are provided in the inner side surface 79X which is substantially parallel with the YZ-plane formed by the recess portion 78. In this embodiment, the supply ports 13A and 13B are provided, of the inner side surface 79 of the recess portion 78 formed in the bottom surface 70A of the nozzle member 70, in one surface in the scanning direction (X-axis direction) with respect to the projection region AR1, to be specific, in the inner side surface 79X that faces to the +X side. In addition, in this embodiment, two supply ports 13 (13A and 13B) are provided in the inner side surface 79X to be aligned in the Y-axis direction. Each of the supply ports 13A and 13B supply the liquid LQ delivered from the liquid supply portion 11 so as to flow substantially in parallel with the surface of the substrate P located on the image plane side of the projection optical system PL, i.e., substantially in parallel with the XY-plane.

A plurality of (two) supply channels 14A, 14B formed inside the supply pipes 12A, 12B and the nozzle member 70 are respectively provided corresponding to the supply ports 13A and 13B. In addition, in the intermediate position of the supply pipes 12A, 12B are respectively provided flow rate controllers 16 (16A, 16B), referred to as mass flow controllers, that control the per-unit-time liquid supply amount of the liquid transmitted from the liquid supply portion 11 with respect to the respective liquid supply ports 13A and 13B. The liquid supply amount control by the flow rate controllers 16A, 16B is performed by a command signal from the controller CONT.

In addition, in this embodiment, each of the supply ports 13A and 13B is formed in a circular shape. Furthermore, the space (distance) between the supply ports 13A and 13B in the Y-axis direction is at least longer than the length of the projection region AR1 in the Y-axis direction. The liquid supply mechanism 10 can supply the liquid LQ simultaneously from each of the supply ports 13A and 13B.

Furthermore, the bottom surface 70A of the nozzle member 70 faces the surface of the substrate P supported by the substrate stage PST, and the supply ports 13A and 13B are provided in the inner side surface 79 (79X) of the recess portion 78. Therefore, the supply ports 13A and 13B are configured so as to supply the liquid above the surface of the substrate P.

The recovery port 23 is provided, on the bottom surface 70A of the nozzle member 70 facing the substrate P, outside the supply ports 13A and 13B of the liquid supply mechanism 10 with respect to the projection region AR1 of the projection optical system PL, and is formed in an annular shape so as to surround the supply ports 13A and 13B and the projection region AR1. More specifically, the recovery port 23 formed on the bottom surface 70A of the nozzle member 70 is provided so as to face the substrate P supported by the substrate stage PST, and located on the image plane side of the projection optical system PL, and to surround the projection region AR1 of the projection optical system PL. In addition, a plurality of porous members 30 (30A to 30E) are arranged over the recovery port 23. The porous members 30 are formed in an annular shape in a planar view.

Furthermore, it is configured such that the supply ports 13A and 13B are provided between the projection region AR1 of the projection optical system PL and the recovery port 23. The liquid LQ for forming the liquid immersion region AR2 is supplied between the projection region AR1 of the projection optical system PL and the recovery port 23 via the supply ports 13A and 13B.

The projection region AR1 of the projection optical system PL is set to be in a rectangular shape with the Y-axis direction (non-scanning direction) as the longitudinal direction. The liquid immersion region AR2 filled with the liquid LQ is formed in a region surrounded by the substantially annular recovery port 23 so as to include the projection region AR1, and besides, it is locally formed on a part of the substrate P during the exposure of the substrate P. Note that it is only required the liquid immersion region AR2 cover at least the projection region AR1. The entire region surrounded by the recovery port 23 need not be a liquid immersion region.

The recovery port 23 is formed, on the bottom surface 70A of the nozzle member 70 at a distance outside the recess portion 78. Furthermore, a flat region 77, which is a substantially flat surface, is provided between the recess portion 78 and the recovery port 23. The flat region 77 is substantially parallel with the XY-plane and faces the substrate P supported by the substrate stage PST. In the following description, the flat region 77 provided around the recess portion 78 will be appropriately referred to as a "land surface."

The recess portion 78 formed in the bottom surface 70A of the nozzle member 70 has the above-described inner side surface 79 and a surface 78A connected to the inner side surface 79. The surface 78A intersects the inner side surface 79, is substantially parallel with the XY-plane, and is formed so as to face the substrate P supported by the substrate stage PST. In the following description, the surface 78A formed inside the recess portion 78 and facing the substrate P will be appropriately referred to as a "cavity surface."

The cavity surface 78A is formed at a position higher than the liquid contact surface 2A of the optical element 2 and the land surface 77 (so as to be more distant with respect to the substrate P). Furthermore, the liquid contact surface 2A of the optical element 2 at the end portion of the projection optical system PL placed in the hole portion 70H of the nozzle member 70 is exposed from the cavity surface 78A. In addition, in this embodiment, the liquid contact surface 2A of the optical element 2 slightly protrudes from the cavity surface 78A in the −Z direction. More specifically, a height difference is formed between the cavity surface 78A and the land surface 77 and another height difference is formed between the cavity surface 78A and the liquid contact surface 2A of the optical element 2.

Moreover, there is still another height difference between the liquid contact surface 2A of the optical element 2 and the land surface 77. To be more specific, the liquid contact surface 2A of the optical element 2 and the land surface 77 are different in position in the Z direction. The distance between substrate P located on the image plane side of the projection optical system PL and the liquid contact surface 2A of the optical element 2 is longer than the distance between the surface of the substrate P and the land surface 77.

When the liquid immersion region AR2 is formed, the liquid LQ in the liquid immersion region AR2 comes into contact with the cavity surface 78A. More specifically, the cavity surface 78A also serves as a liquid contact surface. Furthermore, the cavity surface 78A has a lyophilicity (hydrophilicity) as with the liquid contact surface 2A of the optical element 2 of the projection optical system PL. In this embodiment, at least the cavity surface 78A of the bottom surface 70A of the nozzle member 70 is subjected to lyophilic treatment. The lyophilic treatment allows the cavity surface 78A to be lyophilic as with the liquid contact surface 2A of the optical element 2. It should be noted that the cavity surface 78A need not be subjected to lyophilic treatment in the case where the nozzle member 70 is formed of a lyophilic (hydrophilic) material.

In addition, when the liquid immersion region AR2 is formed, at least a part of the liquid LQ in the liquid immersion region AR2 also comes into contact with the land surface 77 provided so as to surround the cavity surface 78A. More specifically, the land surface 77 also serves as a liquid contact surface. Furthermore, the land surface 77 is less lyophilic with respect to the liquid LQ than the cavity surface 78A and the liquid contact surface 2A of the optical element 2. In other words, the contact angle of the liquid contact surface 2A of the optical element 2 and the cavity surface 78A with respect to the liquid LQ is smaller than the contact angle of the land surface 77 with respect to the liquid LQ. In this embodiment, the contact angle of the liquid contact surface 2A of the optical element 2 and the cavity surface 78A with respect to the liquid LQ is set to about 5 to 20 degrees, and the contact angle of the land surface 77 with respect to the liquid LQ is set to about 80 to 120 degrees.

In this embodiment, the entire region of the land surface 77 is subjected to the liquid-repellent treatment, and thus has a liquid-repellency. Liquid-repellent treatments to the land 77 include: application of a fluoroplastic material such as polytetrafluoroethylene, an acrylic plastic material, and a silicon plastic material; or attachment of a thin film made of the liquid-repellent material made of the above-mentioned liquid-repellent material. In addition, a film for liquid-repellent treatment (surface treatment) may be a single layer film or a film made of multiple layers. As a liquid-repellent material for realizing the liquid-repellency, a material nonsoluble in the liquid LQ is used.

It is configured such that the supply ports 13A and 13B are provided in the inner side surface 79 (79X) that forms a height difference (on the boundary) between the cavity surface 78A and the land surface 77. Therefore, the liquid supply mechanism 10 supplies, between the liquid contact surface 2A of the optical element 2 and the land surface 77, the liquid LQ for forming the liquid immersion region AR2, via the supply ports 13A and 13B.

In FIG. 2, the exposure apparatus EX includes a focus/leveling detection system 80 that detects surface position information of the surface of the substrate P held in the substrate stage PST. The focus/leveling detection system 80 is a so-called oblique entrance type focus/leveling detection system, and includes: a light projecting portion 81 that projects a detection light La obliquely onto the substrate P via the liquid LQ in the liquid immersion region AR2; a light receiving portion 82 that receives reflected light of the detection light La reflected on the substrate P. It is to be noted that as a configuration of the focus/leveling detection system 80, a configuration disclosed in Japanese Unexamined Patent Publication, First Publication No. H08-37149 can be used.

In each of the −Y side and +Y side of the nozzle member 70, recess portions 75, 76 are respectively formed that recess toward the central portion side (the projection optical system PL side). In one recess portion 75 is provided a first optical member 83 capable of transmitting the detection light La emitted from the light projecting portion 81 of the focus/leveling detection system 80; in the other recess portion 76 is provided a second optical member 84 capable of transmitting the reflected light La reflected on the substrate P.

Furthermore, as shown in FIG. 3, in the recess portion 78 formed in the bottom surface 70A, an opening 79K is formed, in part of the inner side surface 79Y that faces to the −X side, for exposing the second optical member 84 disposed in the recess portion 76. Similarly, in the recess portion 78 formed in the bottom surface 70A, an opening (not shown) is formed, in a part of the inner side surface 79Y that faces to the +X side, for exposing the first optical member 83 disposed in the recess portion 75.

The light projecting portion 81 and the light receiving portion 82 are respectively provided on both sides of the projection region AR1 with the projection region AR1 interposed therebetween. In the example shown in FIG. 2, the light projecting portion 81 and the light receiving portion 82 are provided at positions spaced-apart with respect to the projection region AR1 to the ±Y sides, respectively, with the projection region AR1 interposed therebetween.

The light projecting portion 81 of the focus/leveling detection system 80 irradiates the detection light La onto the surface of the substrate P at a predetermined entrance angle with respect to the optical axis AX of the projection optical system PL. The detection light La emitted from the light projecting portion 81 is irradiated onto the first optical member 83, passes through the opening 79K in the inner side surface 79Y, facing to the +Y side, of the recess portion 78 formed in the bottom surface 70A of the nozzle member 70, and is irradiated obliquely onto the substrate P via the liquid LQ above the substrate P. The reflected light of the detection light La having been reflected on the substrate P passes through the opening 79K in the inner side surface 79Y, facing to the −Y side, of the recess portion 78 formed in the bottom surface 70A of the nozzle member 70, then passes through the second optical member 84, and is received by the light receiving portion 82. Here, the light projecting portion 81 of the focus/leveling detection system 80 irradiates a plurality of detection lights La onto the substrate P. This enables the focus/leveling detection system 80 to acquire, for example, respective focus position at each of a plurality of points (positions) aligned in a matrix-like shape on the substrate P, and to detect the position information of the surface of the substrate P in the Z-axis direction and tilt information of the substrate in the θX and θY directions based on the acquired respective focus position at each of the plurality of points.

The controller CONT controls the substrate P held in the Z tilt stage 52 in the Z-axis-direction position (focus position) and in the θX- and θY-direction positions by driving the Z tilt stage of the substrate stage PST via the substrate stage driver PSTD based on the detection results from the focus/leveling detection system 80. More specifically, the Z tilt stage 52 operates based on a command from the controller CONT based on the detection results from the focus/leveling detection system 80 so as to control the focus position (Z position) and tilt angle of the substrate P such that the surface of the substrate P (surface to be exposed) is optimally adjusted to match the image plane formed via the projection optical system PL and the liquid LQ.

It should be noted that in this embodiment, the detection light La of the focus/leveling detection system 80 is irradiated substantially in parallel with the YZ-plane, but it may be irradiated substantially in parallel with the XZ-plane. In that case, the light projecting portion 81 and the light receiving portion 82 may be respectively provided on the ±X sides of the projection region AR1 with the projection region AR1 interposed therebetween, and besides, the first optical member 83 and the second optical member 84 may also be respectively provided on the ±X sides of the projection region AR1 with the projection region AR1 interposed therebetween.

As described above, the first optical member 83 and the second optical member 84 constitute a part of an optical system of the focus/leveling detection system 80 as well as a part of the nozzle member 70. In other words, in this embodiment, a part of the nozzle member 70 also serves as a part of the focus/leveling detection system 80. Furthermore, the nozzle member 70 including the first optical member 83 and the second optical member 84 is supported by a support system not shown, in a condition that the nozzle member 70 is isolated from the optical element 2 at the end portion of the projection optical system PL. It is to be noted that the first optical member 83 and the second optical member 84 may be isolated from the nozzle member 70 so as to be supported by a support system different from that for the nozzle member 70.

Furthermore, since the recess portion 78 is provided in the bottom surface 70A of the nozzle member 70, the focus/leveling detection system 80 can smoothly irradiate the detection light La onto the substrate P in a desired region at a predetermined entrance angle. In a configuration in which the recess portion 78 is not provided in the bottom surface 70A of the nozzle member 70, i.e., the bottom surface 70A of the nozzle member 70 and the bottom surface (liquid contact surface) 2A of the optical element 2 are flush with each other, disadvantages arise such as that when the detection light La of the focus/leveling detection system 80 is intended to be irradiated onto a desired region on the substrate P (specifically, the projection region AR1 on the substrate P, for example) at a predetermined entrance angle, the irradiation of the detection light La is prevented because, e.g., the nozzle member 70 is provided in the optical path of the detection light La, or that the entrance angle or the distance between the bottom surface (liquid contact surface) 2A of the optical element 2 of the projection optical system PL and the surface of the substrate P (working distance) must be changed to ensure the optical path of the detection light La. However, of the bottom surface 70A of the nozzle member 70, the recess portion 78 is provided in the bottom surface 70A of the nozzle member 70 that constitutes a part of the focus/leveling detection system 80. Therefore, while the distance between the bottom surface (liquid contact surface) 2A of the optical element 2 of the projection optical system PL and the surface of the substrate P (working distance) being kept to a desired value, the optical path of the detection light La of the focus/leveling detection system 80 can be ensured and the detection light La can be irradiated onto a desired region on the substrate P.

Additionally, in FIG. 2, the exposure apparatus EX includes an exhaust mechanism 90 that exhausts a gas on the image plane side of the projection optical system PL. The exhaust mechanism 90 includes, for example, a vacuum system (suction apparatus) such as a vacuum pump, a gas-liquid separator that separates a recovered liquid LQ from a gas, and an exhaust portion 91 including a tank that stores the recovered liquid LQ. It should be noted that as the vacuum system, at least one of the vacuum system such as a vacuum pump, the gas-liquid separator, and the tank may be substituted by facilities in a plant where the exposure apparatus is to be installed instead of providing them in the exposure apparatus.

To the exhaust portion 91, one end of recovery pipes 95 (95A, 95B) is connected. The other end of the recovery pipes 95 (95A, 95B) is connected to one end of recovery channels 96 (96A, 96B) formed inside the nozzle member 70.

The other end of the recovery pipe 95A is provided in the recess portion 75 of the nozzle member 70. The one end of the recovery channel 96A is formed in a side surface of the recess portion 75 of the nozzle member 70, and to this one end of the recovery channel 96A is connected the other end of the recovery pipe 95A. In addition, the other end of the recovery pipe 95B is provided in the recess portion 76 of the nozzle member 70. The one end of the recovery channel 96B is formed in a side surface of the recess portion 76 of the nozzle member 70, and to this one end of the recovery channel 96B is connected the other end of the recovery pipe 95B.

As shown in FIG. 3, in the bottom surface 70A of the nozzle member 70, suction ports 98 (98A, 98B) are provided in the vicinity of the optical element 2 of the projection optical system PL. The suction ports 98A, 98B are respectively connected to the other end of the recovery channels 96A, 96B formed inside the nozzle member 70. Furthermore, the suction ports 98A, 98B are respectively connected to the exhaust portion 91 via the recovery channels 96A, 96B and the recovery pipes 95A, 95B. By driving the exhaust portion 91 with a vacuum system, a gas on the image plane side of the projection optical system PL can be exhausted (vacuumed, negatively pressurized) via the suction ports 98A, 98B located in the vicinity of the optical element 2 on the image plane side of the projection optical system PL. Furthermore, the exhaust portion 91 can recover a liquid on the image plane side of the projection optical system PL via the suction ports 98A, 98B since it includes the vacuum system and the gas-liquid separator.

The suction ports 98A, 98B are provided in the cavity surface 78A of the recess portion 78 formed in the bottom surface 70A of the nozzle member 70. The suction ports 98A, 98B are provided, in the cavity surface 78A of the recess portion 78, in the vicinity of the projection region AR1 by the projection optical system PL, and are respectively provided on both sides of the optical element 2 (projection region AR1) with respect to the non-scanning direction (Y-axis direction). Furthermore, a plurality of (two) suction ports 98A, 98B are provided corresponding to the supply ports 13A and 13B.

It is to be noted that the pressure of the liquid LQ supplied from the liquid supply mechanism 10 may be adjusted by adding liquid LQ and recovering a part of the liquid LQ via the suction ports 98 by means of a function to further add liquid LQ to the liquid LQ supplied from the liquid supply mechanism 10 and a function to recover part of the liquid LQ that are provided in advance to the exhaust mechanism 90.

In this embodiment, the nozzle member 70 constitutes a respective part of the liquid supply mechanism 10, the liquid recovery mechanism 20, and the exhaust mechanism 90. Furthermore, the supply ports 13A and 13B that constitute the liquid supply mechanism 10 supply the liquid LQ onto the image plane side of the projection optical system PL with the liquid LQ flowing substantially in parallel with the surface of the substrate P located on the image plane side of the projection optical system PL. In addition, the recovery port 23 constituting the liquid recovery mechanism 20 is provided so as to surround the projection region AR1, the supply ports 13A and 13B, and the suction ports 98 (98A, 98B).

The operations of the liquid supply portion 11 and the flow rate controllers 16A, 16B are controlled by the controller CONT. When supplying the liquid LQ onto the substrate P, the controller CONT delivers the liquid LQ from the liquid supply portion 11, and supplies the liquid LQ to the image plane side of the projection optical system PL, via the supply pipes 12A, 12B and the supply channels 14A, 14B, from the supply ports 13A and 13B arranged at positions spaced at a predetermined distance from the substrate P so as to face the surface of the substrate P. In addition, the respective per-time-unit amount of the liquid LQ supplied from the supply ports 13A and 13B onto the substrate P can be independently controlled by the flow rate controllers 16A, 16B provided in the supply pipes 12A, 12B, respectively.

The liquid recovery operation of the liquid recovery portion 21 is controlled by the controller CONT. The controller CONT can control the per-unit-time liquid recovery amount by the liquid recovery portion 21. The liquid LQ on the substrate P recovered from the recovery port 23 provided above the substrate P is recovered into the liquid recovery portion 21 via the recovery channel 24 and the recovery pipe 22 in the nozzle member 70.

It is to be noted that in this embodiment, the supply pipes 12A, 12B are connected to a single liquid supply portion 11, but a plurality of (in this case, two) liquid supply portions 11 corresponding to the number of supply pipes may be provided, and each of the supply pipes 12A, 12B may be connected to the plurality of liquid supply portions, respectively.

In addition, in this embodiment, it is configured such that the recovery port 23 is formed in an annular shape and that the single recovery channel 24, the single recovery pipe 22, and the single liquid recovery portion 21 that are connected to the recovery port 23 are provided, but the recovery port 23 may be divided in a plurality and the recovery pipes 22 and the liquid recovery portions 21 may be provided according to the number of the recovery ports 23 divided. It is to be noted that even if the recovery port 23 is divided in a plurality, the plurality of recovery ports 23 are preferably located so as to surround the projection region AR1, the supply ports 13, and the suction ports 98.

Figure 4:
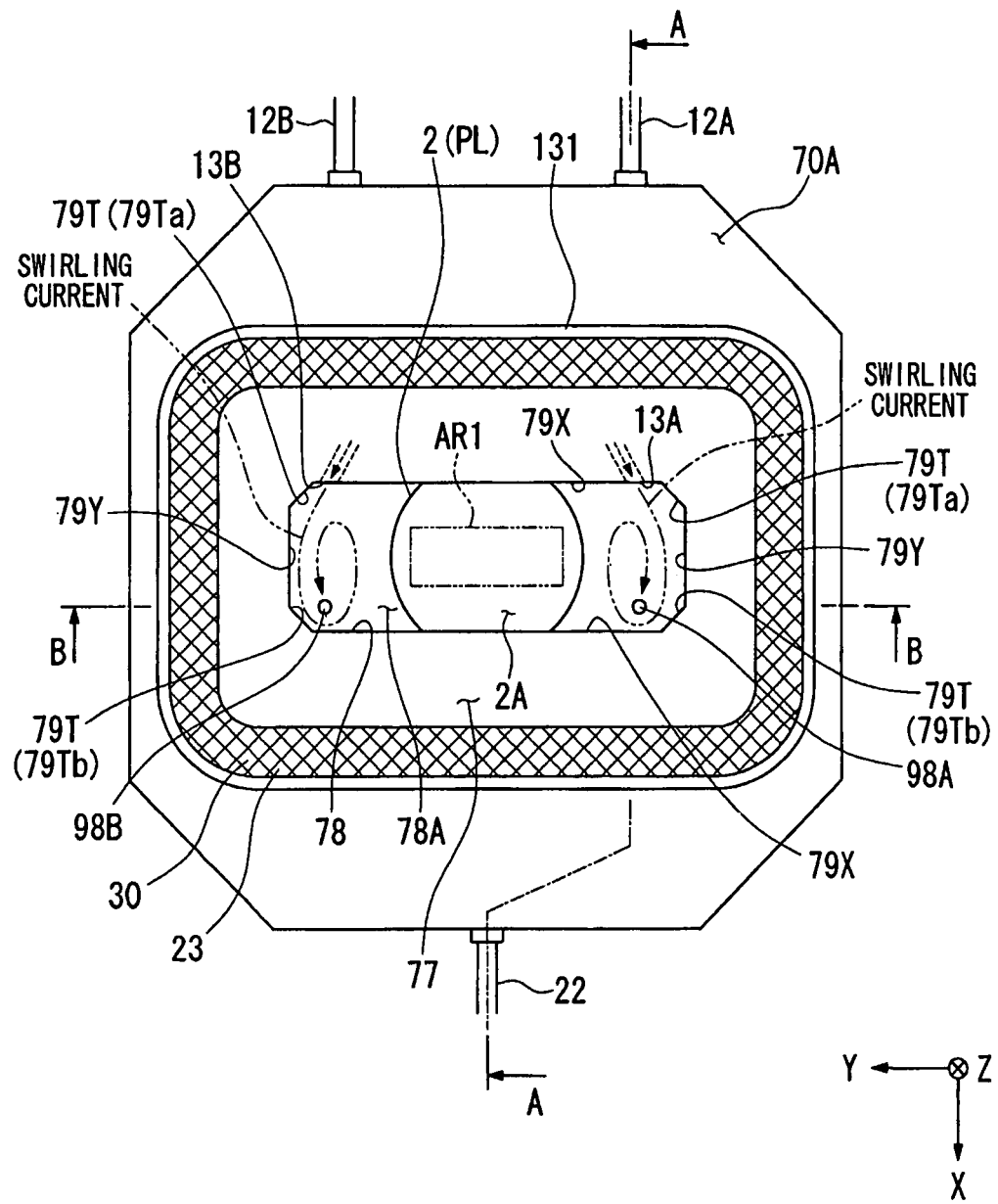
FIG. 4 is a plan view of the nozzle member seen from the bottom surface side.

FIG. 4 is a view for explaining the positional relationship among the supply ports 13A and 13B, and the suction ports 98A, 98B; it is a plan view of the nozzle member 70 seen from the bottom surface 70A side. As shown in FIG. 4, in this embodiment, the suction port 98A and the supply port 13A are provided so as to be substantially aligned with respect to the X-axis direction, and the suction port 98B and the supply port 13B are provided so as to be substantially aligned with respect to the X-axis direction.

Each of the supply ports 13A and 13B is provided on the inner side surface 79X facing the +X side and supplies the liquid LQ delivered from the liquid supply portion 11 so as to flow substantially in parallel with the surface of the substrate P located on the image plane side of the projection optical system PL, i.e., substantially in parallel with the XY-plane. Furthermore, as shown in FIG. 4, in the inner side surface 79 formed by the recess portion (wall portion) 78, the supply port 13A has its flow direction of the liquid LQ adjusted so as to cause the liquid LQ to flow toward the inner side surface 79Y (the inner side surface 79Y facing to the +Y side) arranged in the vicinity of the supply port 13A. In addition, in the inner side surface 79 formed by the recess portion (wall portion) 78, the supply port 13B has its flow direction of the liquid LQ adjusted so as to cause the liquid LQ to flow toward the inner side surface 79Y (the inner side surface 79Y facing to the −Y side) arranged in the vicinity of the supply port 13B. More specifically, each of the supply ports 13A and 13B causes the liquid LQ to flow substantially in parallel with the XY-plane and in an oblique direction with respect to the X-axis direction. Furthermore, in this embodiment, each of the supply ports 13A and 13B causes the liquid LQ to flow along the tapered surface 79Ta which is provided nearest among a plurality of tapered surfaces 79T, and hits the ejected liquid LQ against the respective inner side surface 79Y arranged in the vicinity thereof.

The liquids LQ from the supply ports 13A and 13B toward the inner side surface 79 form swirling currents in the liquids LQ. Here, the supply port 13A supplies the liquid LQ such that the area near the center of the formed swirling current is provided in the suction port 98A. Similarly, the supply port 13B supplies the liquid LQ such that the area near the center of the formed swirling current is provided in the suction port 98B. It should be noted that formation positions of the suction ports 98A, 98B may be appropriately changed such that the respective suction ports 98A, 98B are disposed in the area near the corresponding center of the swirling currents formed by the liquids LQ from the supply ports 13A and 13B.

Figure 5:
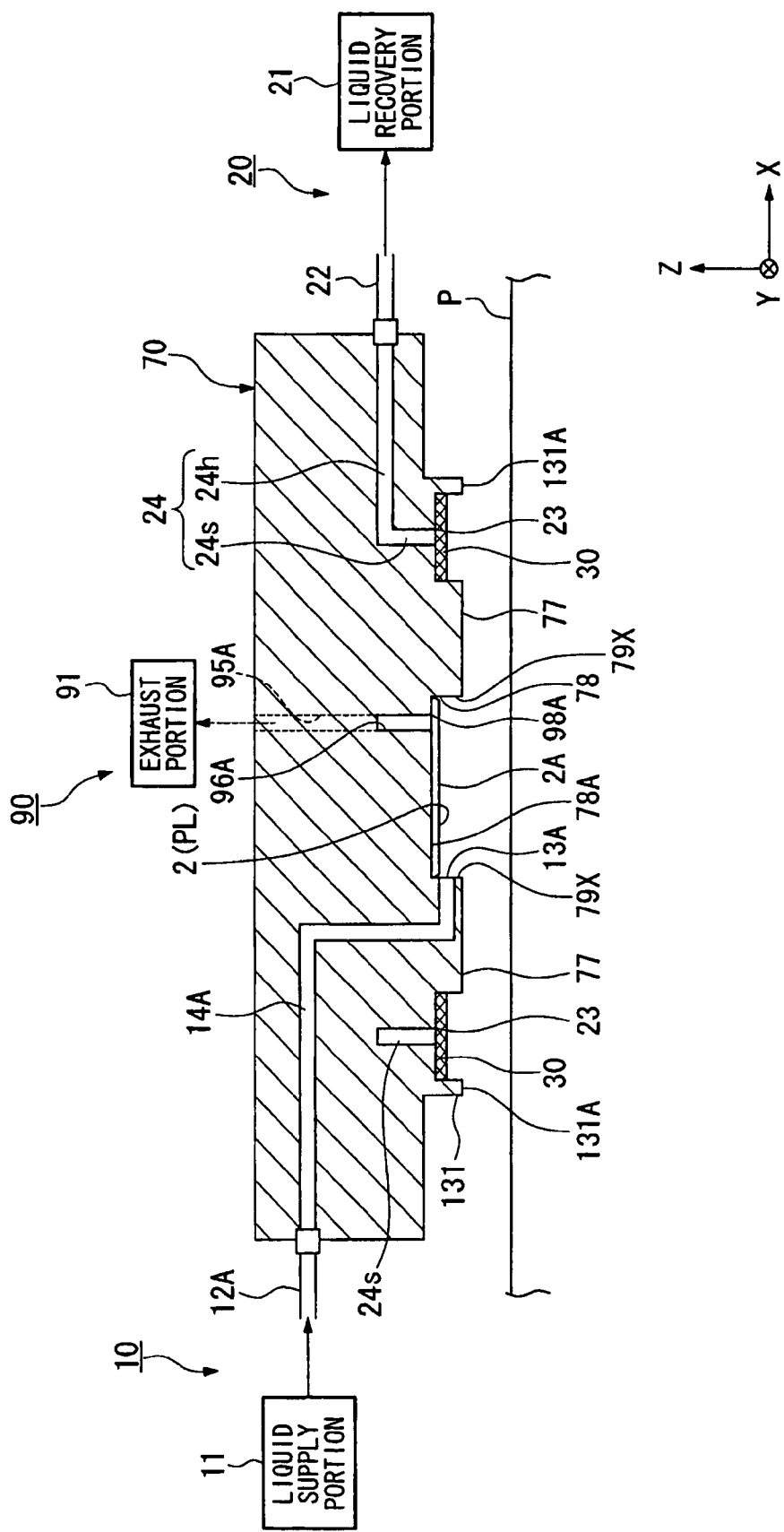
FIG. 5 is a sectional view taken along arrow A-A of FIG. 4.
Figure 6:
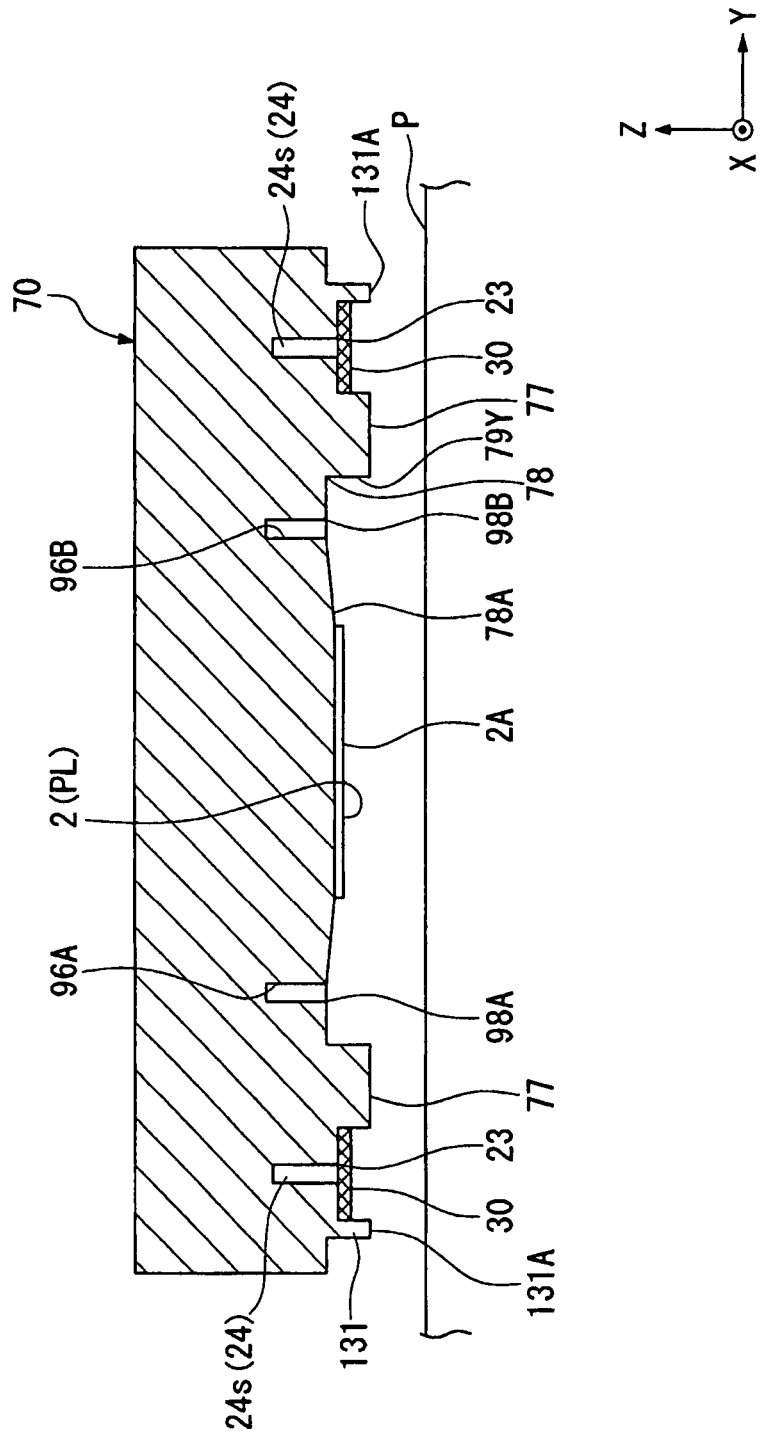
FIG. 6 is a sectional view taken along arrow B-B of FIG. 4.

FIG. 5 is a sectional view taken along arrow A-A of FIG. 4, and FIG. 6 is a sectional view taken along arrow B-B of FIG. 4. In FIG. 5, the supply channel 14A formed inside the nozzle member 70 connects its one end to the supply pipe 12A and its other end to the liquid supply port 13A. The liquid LQ supplied from the liquid supply portion 11 via the supply pipe 12A flows through the supply channel 14A. The liquid LQ is then supplied, substantially in parallel with the surface of the substrate P, onto the image plane side of the projection optical system PL from the supply port 13A. It is to be noted that a description has been given of the supply pipe 12A, the supply channel 14A, and the supply port 13A here, but the supply pipe 12B, the supply channel 14B, and the supply port 13B have the similar configuration.

In FIG. 5 and FIG. 6, the recovery channel 24 connects its one end to the recovery pipe 22 and its other end to the recovery port 23. The recovery channel 24 includes: an annular channel 24s that is formed in an annular shape in a planar view so as to correspond to the recovery port 23 and that connects to the recovery port 23; and a manifold channel 24h whose one end connects to the recovery pipe 22 and whose other end connects to a part of the annular channel 24s. With drive of the liquid recovery portion 21 having a vacuum system, the liquid LQ on the substrate P flows into the annular channel 24s vertically in the upward direction (+Z direction) via the liquid recovery port 23 provided above the substrate P. At this time, the liquid Q on the substrate flows into (is recovered by) the liquid recovery port 23 together with the gas (air) therearound. The liquid LQ flowing into the annular channel 24s in the +Z direction is collected in the manifold channel 24h and is then allowed to flow through the manifold channel 24h. The liquid LQ is then suck-recovered in the liquid recovery portion 21 via the recovery pipe 22.

The land surface 77 of the nozzle member 70 is provided so as to surround the liquid contact surface 2A of the optical element 2 of the projection optical system PL and the cavity surface 78A of the nozzle member 70. The distance between the surface of the substrate P supported by the substrate stage PST and located on the image plane side of the projection optical system PL and the liquid contact surface 2A as well as the cavity surface 78A is longer than the distance between the surface of the substrate P and the land surface 77. As described above, the contact angle of the liquid contact surface 2A and the cavity surface 78A with respect to the liquid LQ is smaller than the contact angle of the land surface 77 with respect to the liquid LQ.

As shown in FIG. 6, the liquid contact surface 2A of the optical element 2 of the projection optical system PL is slightly more protruded than the cavity surface 78A in the −Z direction. In addition, the cavity surface 78A is provided so as to gradually incline upward at outer positions with the projection region AR1 of the optical element 2 as a reference. The distance between the cavity surface 78A and the surface of the substrate P is shortest in the vicinity of the optical element 2, and longest in the vicinity of the suction ports 98A, 98B. More specifically, it is configured such that the suction ports 98A, 98B are disposed, in the vicinity of the liquid contact surface 2A of the projection optical system PL, at a position higher than the liquid contact surface 2A in the Z-axis direction.

In addition, an annular wall portion 131 is formed outside the recovery port 23 with respect to the projection region AR1. The wall portion 131 is a protrusion portion that protrudes toward the substrate P. In this embodiment, the distance between the bottom surface 131A of the wall portion 131 and the substrate P is substantially the same as the distance between the land surface 77 and the substrate P. The wall portion 131 can hold the liquid LQ at least in a part of an inner region thereof.

Figure 7A:
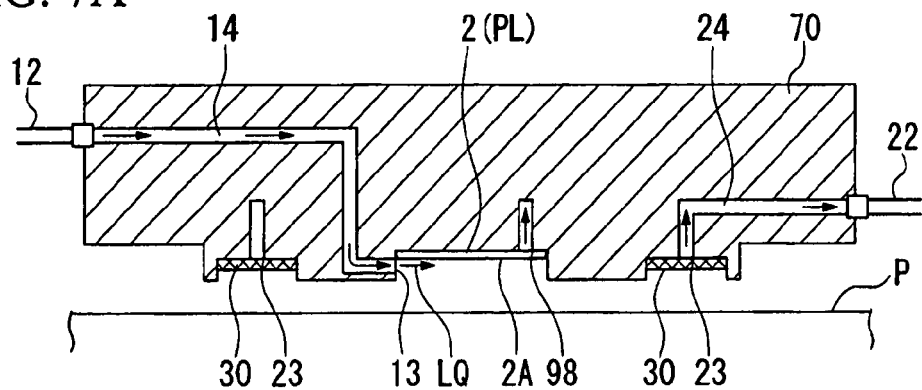
FIG. 7A is a schematic showing an example of operations of an exposure apparatus of the present invention.

Next, a method of exposing an image pattern of the mask M onto the substrate P by using an exposure apparatus EX with the configuration described above will be made with reference to the schematics shown in FIGS. 7A to 7C.

After the mask M is loaded onto the mask stage MST and at the same time the substrate P is loaded on the substrate stage PST, the controller CONT begins to perform a scanning exposure process by driving the liquid supply mechanism 10 to start the liquid supply operation onto the substrate P. The liquid LQ supplied from the liquid supply portion 11 of the liquid supply mechanism 10 for forming the liquid immersion region AR2 is, after flowing through the supply pipe 12 and the supply channel 14, supplied from the supply port 13 onto the image plane side of the projection optical system PL, as shown in FIG. 7A.

It is to be noted that the liquid supply operation for forming the liquid immersion region AR2 on the image plane side of the projection optical system PL prior to the exposure of the substrate P is performed with the projection optical system PL and the substrate P facing each other. It is to be noted that the above liquid supply operation may be performed with the projection optical system PL and a predetermined region on the substrate stage PST (the top surface 51, for example) facing each other. In addition, when the liquid immersion region AR2 is formed on the image plane side of the projection optical system PL prior to the exposure of the substrate P, the formation may be performed with the substrate stage PST being stopped or being slightly moved.

The controller CONT, when starting to supply the liquid LQ for forming the liquid immersion region AR2 by using the liquid supply mechanism 10, drives the liquid recovery portion 21 of the liquid recovery mechanism 20 as well as the exhaust portion 91 of the exhaust mechanism 90. With drive of the exhaust portion 91 having a vacuum system, the gas in the space in the vicinity of the image plane side of the projection optical system PL is discharged (exhausted) from the suction port 98 provided in the vicinity of the optical element 2 on the image plane side of the projection optical system PL, and the space is negatively pressurized.

Thus, the controller CONT drives the exhaust portion 91 of the exhaust mechanism 90, and starts the liquid supply by the liquid supply mechanism 10 for forming the liquid immersion region AR2 while exhausting the gas on the image plane side of the projection optical system PL via the suction port 98 disposed in the vicinity of the projection region AR1 of the projection optical system PL.

In this embodiment, there is a high possibility that, when the liquid LQ is supplied for forming the liquid immersion region AR2, a gas portion such as a bubble may remain in the liquid LQ in the liquid immersion region AR2 and that the gas may be mixed into the liquid LQ, since the recess portion 78 of the nozzle member 70 is formed on the image plane side of the projection optical system PL. The generation of a gas portion causes various phenomena in which the gas portion prevents the exposure light EL for forming a pattern image on the substrate P from reaching the substrate P; in which the gas portion prevents the exposure light EL for forming a pattern image on the substrate P from reaching a desired position on the substrate P; in which the gas portion prevents, for example, the detection light La of the focus/leveling detection system 80 from reaching the substrate P or the light receiving portion 82; or in which the gas portion prevents, the detection light La of the focus/leveling detection system 80 from reaching a desired position on the substrate P. This leads to deterioration of exposure accuracy and measurement accuracy. In this embodiment, however, the supply of the liquid LQ by the liquid supply mechanism 10 is started while the exhaust of the gas on the image plane side of the projection optical system PL is being performed via the suction port 98 disposed in the vicinity of the projection region AR1 of the projection optical system PL. Therefore, the liquid LQ can be smoothly located in the recess portion 78. More specifically, since the vicinity of the suction ports 98 is negatively pressurized by exhausting gas from the suction port 98, the supplied liquid LQ can be smoothly located in the negatively pressurized area (space) that is negatively pressurized. Therefore, a disadvantage that a gas portion remains in the liquid immersion region AR2 formed on the image plane side of the projection optical system PL or the disadvantage of a bubble mixing into the liquid LQ for forming the liquid immersion region AR can be prevented. Also, the liquid contact surface 2A of the optical element 2 of the projection optical system PL arranged inside the recess portion 78 can be covered sufficiently with the liquid LQ. Therefore, high exposure accuracy and high measurement accuracy can be obtained.

In addition, the recess portion 78 (optical path of the exposure light EL) can be speedily filled with the liquid LQ by supplying the liquid LQ from the supply port 13 provided in the inner side surface 79 of the recess portion 78 while exhausting the gas from the suction port 98 provided in the cavity surface 78A of the recess portion 78. Therefore, the throughput can be increased.

In addition, in this embodiment, it is configured such that the liquid supply mechanism 10 causes the liquid LQ to flow from the supply port 13 formed in the inner side surface 79X of the recess portion 78, substantially in parallel with the surface of the substrate P, and that the suction port 98 is provided near the center of the swirling currents formed by the supplied liquids LQ. Therefore, even if a bubble (gas portion) is present in the liquid LQ, the exhaust mechanism 90 can remove the bubble by suck-recovering the bubble well from the suction port 98 disposed near the center of the swirling current, since the bubble moves to the area near the center of the swirling current based on the difference in specific gravity with respect to the liquid. Therefore, the disadvantage of a bubble mixing into the liquid LQ on the image plane side of the projection optical system PL can be prevented.

In addition, in this embodiment, the suction port 98 of the exhaust mechanism 90 is provided, inside the recess portion 78, at a position higher than the liquid contact surface 2A of the projection optical system PL. Therefore, even if a bubble (gas portion) is present in the liquid LQ, the gas moves upward in the liquid LQ due to the difference in specific gravity with respect to the liquid LQ and is recovered from the suction port 98 smoothly and speedily. In addition, the cavity surface 78A is provided so as to gradually incline upward at outer positions with the optical element 2 (projection region AR1) as a reference and has no corner portion. Therefore, when a bubble in the vicinity of the optical element 2 moves to the suction port 98 along the cavity surface 78A, the movement is smooth.

It should be noted that, as described above, the sealing member is provided in the gap between the inner side surface 70T of the nozzle member 70 and the side surface 2T of the optical element 2. Therefore, even if the suction is performed from the suction port 98 of the exhaust mechanism 90, penetration of a gas through the gap can be blocked.

It is to be noted that, in this embodiment, each of the supply ports 13A and 13B is provided on the same side (inner side surface 79X facing the +X side) with respect to the projection region AR1. With this configuration, respective swirling currents by the liquids LQ respectively from the supply ports 13A and 13B are suitably formed. For example, in the case where one supply port 13A is formed in the inner side surface 79X facing the +X side and the other supply port 13B is formed in the inner side surface 79X facing to the −X side, there occurs the possibility that the swirling currents formed by the liquids LQ respectively from the supply ports 13A and 13B will not be formed sufficiently as a result of mutual interference. However, swirling currents can be formed sufficiently by providing each of the supply ports 13A and 13B on the same side (inner side surface 79X facing the +X side) with respect to the projection region AR1 as in this embodiment. Therefore, a bubble present in the liquid LQ can be moved to the vicinity of the suction port 98 to be recovered (removed) well.

In addition, in this embodiment, it is configured such that the distance between the liquid contact surface 2A of the projection optical system PL as well as the cavity surface 78A and the surface of the substrate P is longer than the distance between the land surface 77 therearound and the surface of the substrate P. Moreover, the contact angle of the liquid contact surface 2A and the cavity surface 78A with respect to the liquid LQ is smaller than the contact angle of the land surface 77 with respect to the liquid LQ. As a result, when the supply of the liquid LQ onto the image plane side of the projection optical system PL is started, the supplied liquid LQ wets and spreads over the liquid contact surface 2A of the projection optical system PL and the cavity surface 78A so as to cover them, and subsequently wets and spreads over the land surface 77. Therefore, the disadvantage of a gas portion (bubble) remaining inside the land surface 77, i.e., between at least the liquid contact surface 2A of the projection optical system PL in the liquid immersion region AR2 and the substrate P (that is, in an optical path of the exposure light EL) can be prevented.

If the contact angle of the land surface 77 with respect to the liquid LQ is small and the contact angle of the land surface 77 with respect to the liquid is about the same as the contact angle of the liquid contact surface 2A of the optical element 2 or the cavity surface 78A with respect to the liquid LQ, it is highly possible that the liquid LQ supplied from the supply ports 13 first wets and spreads between the land surface 77 and the substrate P since the distance between the land surface 77 and the substrate P is short. Furthermore, there is a possibility that the liquid LQ will not sufficiently wet and spread between the liquid contact surface 2A of the optical element 2 and the substrate or the region between the cavity surface 78A and the substrate P. In addition, if the liquid LQ first wets and spreads over the entirely of the region between the land surface 77 and the substrate P and a gas remains inside the recess portion 78 or the like, it is also possible that it will be difficult for a gas inside the space formed by the recess portion 78 to be discharged to the outside due to the liquid LQ filled between the land surface 77 and the substrate P. However, in this embodiment, the contact angle of the liquid contact surface 2A of the projection optical element PL and the cavity surface 78A with respect to the liquid LQ is smaller than the contact angle of the land surface 77 with respect to the liquid LQ, thus making the affinity of the liquid contact surface 2A of the projection optical element PL and the cavity surface 78A for the liquid LQ higher than the affinity of the land surface 77 for the liquid LQ. Therefore, even if the liquid LQ is supplied from the supply ports 13 between the liquid contact surface 2A and the land surface 77, the liquid LQ first wets and spreads sufficiently between the liquid contact surface 2A of the projection optical system PL as well as the cavity surface 78A and the substrate P, and subsequently wets and spreads between the land surface 77 and the substrate P. Therefore, even if the distance between the land surface 77 and the substrate P is shorter than the distance between the liquid contact surface 2A as well as the cavity surface 78A and the substrate P, the disadvantage of gas remaining in the recess portion 78 can be prevented, and the liquid immersion region AR2 with no gas portion can be formed speedily. Therefore, throughput can be increased, and high exposure accuracy and high measurement accuracy can be obtained.

Figure 7B:
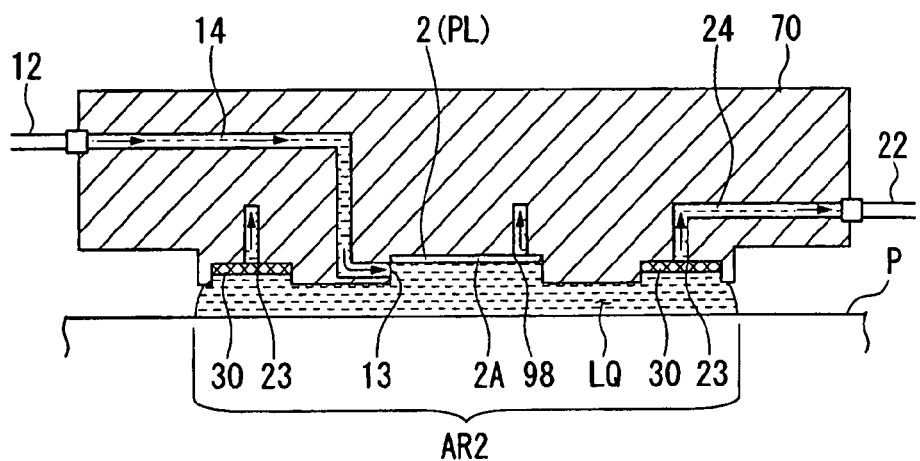
FIG. 7B is a schematic showing an example of operations of an exposure apparatus of the present invention.

As described above, the controller CONT performs the supply of the liquid LQ via the supply ports 13A and 13B of the liquid supply mechanism 10 in parallel with the recovery of the liquid LQ via the recovery port 23 of the liquid recovery mechanism 20 and in a short time, forms locally, between the projection optical system PL and the substrate P, the liquid immersion region AR2 smaller than the substrate P and larger than the projection region AR1 so as to include the projection region AR1, as shown in FIG. 7B.

Figure 7C:
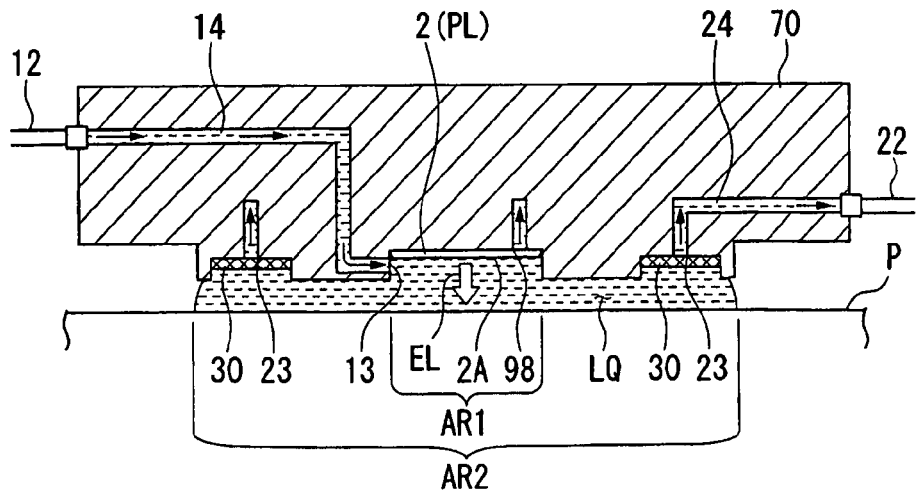
FIG. 7C is a schematic showing an example of operations of an exposure apparatus of the present invention.

After forming the liquid immersion region AR2, as shown in FIG. 7C, the controller CONT irradiates the exposure light EL onto the substrate P, with the projection optical system PL and the substrate P facing each other, and exposes a pattern image of the mask M onto the substrate P via the projection optical system PL and the liquid LQ. When exposing the substrate P, the controller CONT projection-exposes the pattern image of the mask M onto the substrate P via the liquid LQ between the projection optical system PL and the substrate P as well as the projection optical system PL while performing the supply of the liquid LQ by the liquid supply mechanism 10 in parallel with the recovery of the liquid LQ by the liquid recovery mechanism 20 and while moving the substrate stage PST that supports the substrate P in the X-axis direction (scanning direction). At this time, the controller CONT, while using the flow rate controllers 16A, 16B of the liquid supply mechanism 10 to adjust the per-unit-time liquid supply amount, supplies the liquid LQ with the liquid LQ flowing substantially in parallel with the surface of the substrate P via the supply ports 13A and 13B. In addition, during the exposure of the substrate P, the controller CONT performs the exposure while using the focus/leveling detection system 80 to detect position information of the surface of the substrate P via the liquid LQ, and driving, for example, the Z tilt stage 52 so as to match the image plane by the projection optical system PL with the surface of the substrate P.

In this embodiment, it is configured such that the recess portion 78 is provided in the bottom surface 70A of the nozzle member 70 and that the supply ports 13 are provided in the inner side surface 79X of the recess portion 78. With this configuration, the flow direction of the liquid LQ from the supply ports 13 can be substantially in parallel with the surface of the substrate P. Furthermore, when the liquid LQ for forming the liquid immersion region AR2 is supplied, the force of the liquid LQ exerted on the substrate P can be suppressed since the liquid LQ flows substantially in parallel with the surface of the substrate P via the supply ports 13. For example, in the case where the liquid LQ is supplied from above the surface of the substrate P along the direction that intersects the surface of the substrate P (i.e., in the case where the liquid LQ is supplied downward in the vertical direction), there is a possibility that the substrate P is in a state of being pressed by the supplied liquid LQ, causing deformation of the substrate P. In addition, if the pressure of the liquid LQ is increased on the edge of the substrate P at the time of immersion-exposure of the edge area E of the substrate P or at other times, the possibility becomes higher accordingly that the liquid LQ leaks out from the gap around the substrate P. However, in this embodiment, the force of the liquid LQ exerted on the substrate P can be suppressed since the liquid LQ is supplied substantially in parallel with the surface of the substrate P. Therefore, the disadvantage of the substrate P being deformed by the supplied liquid LQ, or the disadvantage of the liquid LQ leaking out can be prevented, and thus high exposure accuracy and high measurement accuracy can be obtained.

Even during the exposure of the substrate P, the controller CONT continues the recovery of a part of the liquid LQ in the liquid immersion region AR2 via the suction port 98 of the exhaust mechanism 90. With this operation, even if a bubble is mixed into the liquid LQ in the liquid immersion region AR2 or a gas portion is generated in the liquid LQ during the exposure of the substrate P, the bubble (gas portion) can be recovered and removed via the suction port 98. Especially, the suction port 98 is provided closer to the optical element 2 of the projection optical system PL than the recovery port 23, and thus can quickly recover a bubble, etc., present in the vicinity of the optical element 2 of the projection optical system PL.

As described above, since the liquid supply mechanism 10 causes the liquid LQ to flow from the supply ports 13 substantially in parallel with the surface of the substrate P, a force of the supplied liquid LQ exerted on the substrate P can be suppressed.

Therefore, the disadvantage of the substrate P and/or the substrate stage PST being deformed by the supplied liquid LQ or the like can be prevented. Therefore, high exposure accuracy and high measurement accuracy can be obtained.

In addition, the contact angle of the liquid contact surface 2A and the cavity surface 78A with respect to the liquid LQ is smaller than the contact angle of the land surface 77 with respect to the liquid LQ. Thus, when the supply of the liquid LQ to the image plane side of the projection optical system PL is started, the supplied liquid LQ wets and spreads over the cavity surface 78A including the liquid contact surface 2A of the projection optical system PL so as to cover the cavity surface 78A, and subsequently wet and spread over the land surface 77. Therefore, the disadvantage of a gas portion (bubble) being generated between at least the liquid contact surface 2A of the projection optical system PL in the liquid immersion region AR2 and the substrate P (that is, in an optical path of the exposure light EL) can be prevented, and the liquid immersion region AR2 with no gas portion can be formed speedily. Therefore, the throughput can be increased, and high exposure accuracy and high measurement accuracy can be obtained.

It is to be noted that in the above-described embodiment, the entire area of the land surface 77 is described as liquid-repellent, but a part thereof may be liquid-repellent. As described above, when the liquid LQ first wets and spreads between the land surface 77 and the substrate P, it is highly possible that a gas will remain inside the space formed by the recess portion 78, etc. Thus, when part of the land surface 77, for example, only a region in the vicinity of the projection optical system PL (e.g., only the land surface on the +X side in the recess portion 78) is made to be liquid-repellent, the liquid LQ does not wet and spread over the liquid-repellent region. Therefore, the gas remaining inside the space formed by the recess portion 78 is emitted out of the liquid-repellent region. It is to be noted that the liquid-repellent region may be formed in one region or any plurality of regions when it is formed in part of the land surface 77.

In addition, the land surface 77A may be formed of a member other than the nozzle member 70 (e.g., a material with a liquid-repellency such as polytetrafluoroethylene or acrylic resin) without subjecting the land surface 77 to liquid-repellent treatment.

Figure 8:
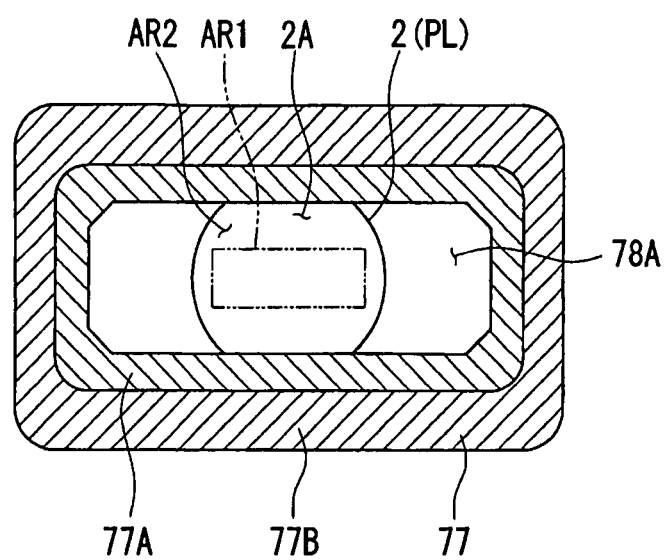
FIG. 8 is a view to explain a variation of a land surface according to the present invention.

In addition, as another example of making part of the land surface 77 liquid-repellent, as shown in FIG. 8, the inner region 77A of the land surface 77 may be made liquid-repellent (water-repellent) as described above, and the outer region 77B thereof may be made lyophilic as with the cavity surface 78A. FIG. 8 is a partially enlarged view of the bottom surface 70A of the nozzle member 70, in which the contact angle of the land surface 77A with a predetermined width in the land surface 77 with respect to the liquid LQ is set to be large, i.e., about 80 to 120 degrees, and the contact angle of the outer region 77B thereof with a predetermined width is set to be small, i.e., about 5 to 40 degrees. Also in this case, when the supply of the liquid LQ from the liquid supply mechanism 10 is started, the liquid LQ wets and spreads over the liquid contact surface 2A of the projection optical system PL and the cavity surface 78A so as to contact them, and subsequently wets and spreads over the land surface 77 (77A and 77B). Therefore, no gas portion is left between the liquid contact surface 2A of the projection optical system PL and the substrate P, and thus a liquid immersion region AR2 with no gas portion can be formed smoothly. In addition, the leakage of the liquid LQ can also be suppressed when the substrate P is moved with respect to the nozzle member 70 (liquid immersion region AR2) during the exposure of the substrate P.

It should be noted that in the above-described embodiment, the per-unit-time liquid supply amount prior to the exposure of the substrate P (the states shown in FIGS. 7A and 7B) and the per-unit-time liquid supply amount during the exposure of the substrate P (the state shown in FIG. 7C) may be set to different values. The liquid supply amount prior to the exposure of the substrate P may be larger than the liquid supply amount during the exposure of the substrate P; e.g., the per-unit-time liquid supply amount prior to the exposure of the substrate P is set to about 2 liters/minute, and the per-unit-time liquid supply amount during the exposure of the substrate P is set to about 0.5 liters/minute. With the liquid supply amount prior to the exposure of the substrate P being large, for example, while a gas (bubble) in a space on the liquid contact surface 2A of the optical element 2 or the bottom surface 70A of the nozzle member 70 is being removed, the space can be filled with the liquid LQ quickly. In addition, since the supply amount of the liquid LQ during the exposure of the substrate P is small during the exposure of the substrate P, vibration to the projection optical system PL, etc. can be suppressed. Contrary to the above, the liquid supply amount prior to the exposure of the substrate P may be smaller than the liquid supply amount during the exposure of the substrate P. With the liquid supply amount prior to the exposure of the substrate P being small, while a gas (bubble) in a space on the liquid contact surface 2A or the bottom surface 70A of the nozzle member 70 is being securely expelled, the space can be filled with the liquid LQ. In addition, by making the liquid supply amount during the exposure of the substrate P relatively large, change in temperature (variation in temperature distribution) of the liquid LQ on the image plane side of the projection optical system PL can be suppressed, and imaging performed via the liquid LQ and detection by the focus/leveling detection system 80 can be performed with good accuracy. In this way, the liquid supply amount prior to the exposure of the substrate P and the liquid supply amount during the exposure of the substrate P may be appropriately set, considering the shape of the bottom surface 70A of the nozzle member 70, the contact angle of the bottom surface 70A of the nozzle member 70 with respect to the liquid LQ, the contact angle of the surface of the substrate P with respect to the liquid LQ, vibration-isolation performance of the projection optical system PL or of the nozzle member 70, exposure conditions, a target throughput, target imaging performance, etc.

Similarly, the suction force (per-unit-time liquid suction amount) via the suction port 98 prior to the exposure of the substrate P and the suction force via the suction port 98 during the exposure of the substrate P may be set to different values. For example, by making the suction force via the suction port 98 prior to the exposure of the substrate P stronger than the suction force during the exposure of the substrate P, a bubble attached to the liquid contact surface of the optical element 2 or of the nozzle member 70, a bubble attached to the surface of the substrate P, or a bubble (gas portion) floating in the liquid in the liquid immersion region AR2 can be securely suck-recovered and removed. Thus, when the substrate P is exposed, the liquid LQ and a bubble in the liquid LQ can be recovered and removed from the suction port 98, with the generation of vibration involved in a suction operation being suppressed, by performing the suction operation with the optimal suction force via the suction port 98.

It is to be noted that in the above-described embodiment, as shown in FIG. 4, the supply ports 13A and 13B supply the liquids LQ so as to flow toward the inner side surfaces 79Y facing in the −Y direction and the +Y direction, but the liquids LQ may flow toward the tapered surfaces 79Tbs at far positions among the plurality of tapered surfaces 79T. Alternatively, the supply ports 13A and 13B may be adapted to hit the liquids LQ against the side surface 2T (the region of the side surface 2T more protruded than the cavity surface 78A). What is essential is that swirling currents are formed by the liquids LQ from the supply ports 13A and 13B.

In addition, flow direction and flow strength (per-unit-time liquid supply amount) of the liquids LQ from the supply ports 13A and 13B may be appropriately changed such that swirling currents are formed by the liquids LQ in accordance with the shape (direction) of the inner side surface 79, etc. Contrary to this, the shape of the inner side surface 79, etc. may be appropriately changed such that swirling currents are formed by the liquids LQ from the supply ports 13A and 13B.

It is to be noted that in the above-described embodiment, the supply ports 13A and 13B are circle-shaped, but they can be formed into any shape such as a rectangular shape or a polygon shape. In addition, when a plurality of supply ports 13 are provided, the plurality of supply ports 13 may be formed so as to be different from each other in size or shape. Moreover, the number, location position, size, and shape of the supply ports 13 can be set to be any as long as it is configured such that swirling current(s) are suitably formed by the liquid(s) LQ from the supply port(s) 13 and that the suction port(s) 98 are located near the center of the formed swirling current(s). For example, in the above-described embodiment, to form the swirling currents, each of the supply ports 13A and 13B is provided in the inner side surface 79X facing the +X side. However, for example, the supply port 13A may be provided in the inner side surface 79X facing to the +X side, and the supply port 13B may be provided in the inner side surface 79X facing the −X side as long as the swirling currents can be suitably formed. Alternatively, the supply ports 13A and 13B may be provided in the inner side surfaces 79Y facing the ±Y sides. In addition, a plurality of the supply ports 13A and 13B may be provided so as to be different from each other in size or shape.

In addition, in the above-described embodiment, the supply ports 13A and 13B supply the liquids LQ so as to flow substantially in parallel with the XY-plane, but for example, the liquids LQ may flow in an oblique direction facing slightly to the +Z side or the −Z side. For example, by the liquid LQ being supplied so as to flow in an oblique direction, a force exerted on the substrate P can be further decreased. In addition, by the liquid LQ being supplied so as to flow in an oblique direction, remaining of a bubble (gas portion) can be suppressed.

It is to be noted that in the above-described embodiment, to form the swirling currents in the liquids LQ, the liquids LQ flow from the supply ports 13 to the inner side surface 79 of the recess portion (wall portion) 78. However, for example, an apparatus having an actuator such as a screw (stirring apparatus) may be provided inside the recess portion 78, and swirling currents may be formed with the apparatus.

It is to be noted that as described above, a pressure of the liquid LQ supplied from the liquid supply mechanism 10 may be adjusted by adding the liquid LQ and recovering a part of the liquid LQ via the suction port 98 by means of a function to further add liquid LQ to the liquid LQ supplied from the liquid supply mechanism 10 and a function to recover a part of the liquid LQ that is provided in advance to the exhaust mechanism 90. In this case, for example, a pressure sensor is provided in a position of the liquid immersion region AR2 that comes into contact with the liquid LQ, such as a part of the bottom surface 70A of the nozzle member 70, and the pressure of the liquid LQ in the liquid immersion region AR2 is always monitored with the pressure sensor during the immersion-exposure of the substrate P. Furthermore, the controller CONT may be adapted to use the exhaust mechanism 90 to adjust the pressure of the liquid LQ supplied from the liquid supply mechanism 10 onto the substrate P, during the immersion-exposure of the substrate P, based on the detection results from the pressure sensor. This can reduce the force of the liquid LQ exerted on the substrate P.

It should be noted that in the above-described embodiment, the description has been given of the case where the liquid immersion region AR2 of the liquid LQ is formed on the substrate P, but a configuration can be conceived in which, on the substrate stage PST, a reference member including, for example, a reference mark measured by a reference alignment system as disclosed in Japanese Unexamined Patent Application, First Publication No. H04-65603 and a reference mark measured by a mask alignment system as disclosed in Japanese Unexamined Patent Application, First Publication No. H07-176468 are arranged and in which the liquid immersion region AR2 of the liquid LQ is formed on the reference member. Furthermore, a configuration can be conceived in which various measurements are performed via the liquid LQ in the liquid immersion region AR2 on the reference member. Also in that case, the exposure apparatus EX according to the present invention can perform measurements with good accuracy, with a force exerted on the reference member being suppressed. Similarly, a configuration can be conceived in which, as optical sensors, for example, an illuminance non-uniformity sensor as disclosed in Japanese Unexamined Patent Application, First Publication No. S57-117238, a space image measurement sensor as disclosed in Japanese Unexamined Patent Application, First Publication No. 2002-14005, and an irradiated light amount sensor (illuminance sensor) as disclosed in Japanese Unexamined Patent Application, First Publication No. H11-16816 are provided on the substrate stage PST, and a configuration can be conceived in which the liquid immersion region AR2 of the liquid LQ is formed on the optical sensors and in which various measurements are performed via the liquid LQ. Also in that case, the exposure apparatus EX according to the present invention can perform measurements with good accuracy, with the force exerted on the optical sensors being suppressed.

It is to be noted that in the above-described embodiment, the description has been given of the case where the distance between the land surface 77 and the surface of the substrate P is shorter than the distance between the liquid contact surface 2A of the projection optical system PL and the surface of the substrate P, but also in the case where these distances are substantially the same (for example, in the case where the liquid contact surface 2A and the bottom surface 70A of the nozzle member 70 are substantially flush with each other), it is effective for the contact angle of the liquid contact surface 2A with respect to the liquid LQ to be smaller than the contact angle of the land surface 77 with respect to the liquid LQ.

In addition, the difference between the contact angle of the liquid contact surface 2A with respect to the liquid LQ and the contact angle of the land surface 77 with respect to the liquid LQ can be appropriately determined in accordance with the position of the liquid contact surface 2A in the Z direction, the configuration of the bottom surface 70A of the nozzle member 70 (the position of the land surface 77 in the Z direction). For example, in the case where the distance between the land surface 77 and the surface of the substrate P is very short and the distance between the liquid contact surface 2A and the surface of the substrate P is relatively long, it is only required to set the respective contact angles of the liquid contact surface 2A and the land surface 77 with respect to the liquid LQ so as to make the difference between the contact angles larger.

In addition, unlike the above-described embodiment, the configuration in which the liquids LQ flow from the supply ports 13 substantially in parallel with the surface of the substrate P (XY-plane) and the configuration in which the contact angle of the liquid contact surface 2A with respect to the liquid LQ is smaller than the contact angle of the land surface 77 with respect to the liquid LQ need not be used concurrently. For example, even in the case where liquid supply of the liquid supply mechanism is performed downward from above the substrate P, the configuration in which the contact angle of the liquid contact surface 2A with respect to the liquid LQ is smaller than the contact angle of the land surface 77 with respect to the liquid LQ works effectively as in the above-described embodiment. On the other hand, as for the configuration in which the liquids LQ flow from the supply ports substantially in parallel with the surface of the substrate P (XY-plane), the configuration of the bottom surface 70A of the nozzle member 70 and the affinity (contact angle) for the liquid LQ of the same are not limited to the above-described embodiment, and a force of the liquid LQ to press the substrate, etc., is effectively suppressed.

Figure 9:
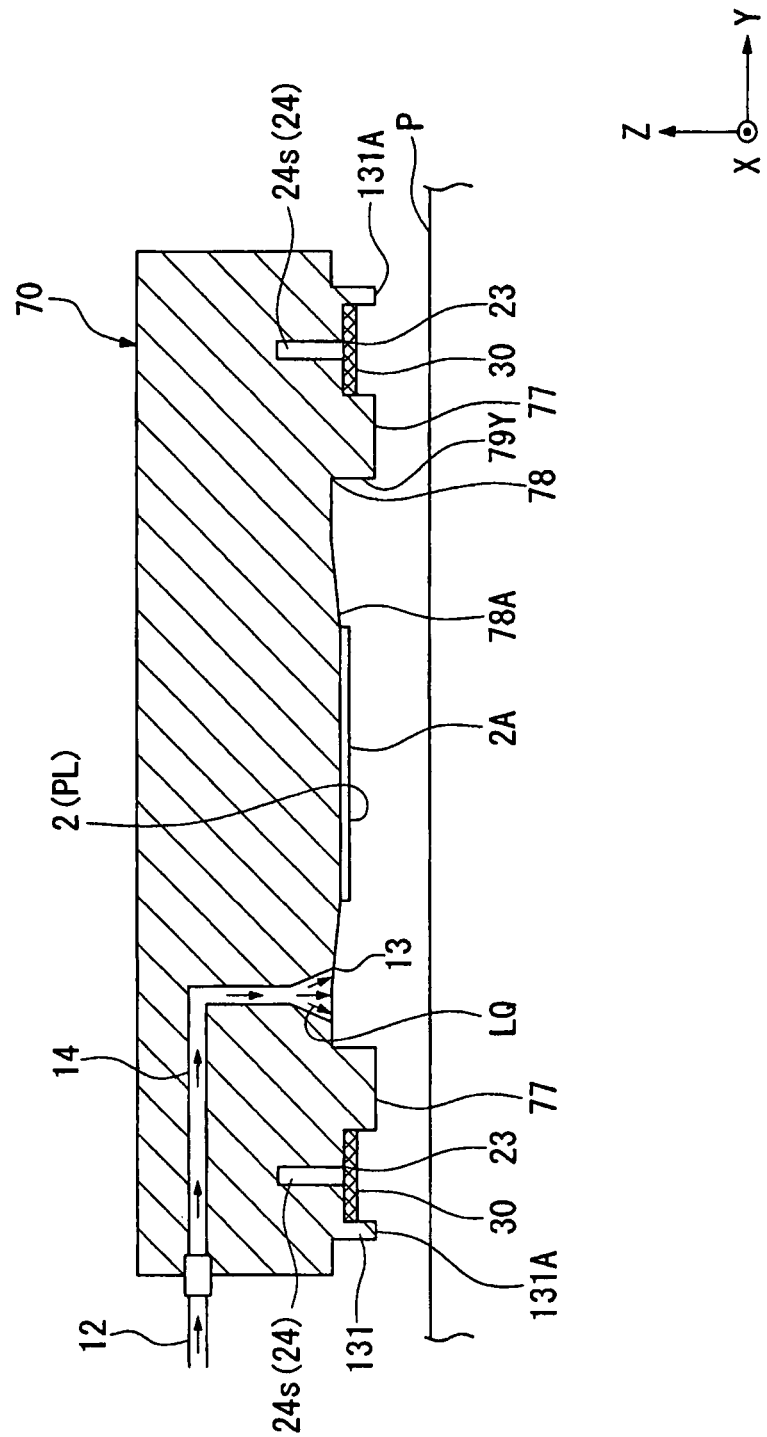
FIG. 9 is a sectional view showing another embodiment of a nozzle member according to the present invention.

FIG. 9 is a view showing another embodiment of a supply port. In the following description, the identical or equivalent constituent elements as those in the above-described embodiment are denoted by the same reference numerals, and their descriptions will be abridged or omitted.

In FIG. 9, the supply port 13 (13A and 13B) is provided in the cavity surface 78A of the recess portion 78 in which the optical element 2 of the projection optical element PL is disposed. The supply port 13 is provided so as to face in the −Z direction in the bottom surface 70A of the nozzle member 70, and supplies the liquid LQ onto the surface of the substrate P from above in the vertically downward direction (−Z direction). Furthermore, of the supply channel 14 that is formed inside the nozzle member 70 and that is connected to the supply port 13, the vicinity of the supply port 13 is formed in a trumpet-like shape so as to be gradually wider toward the supply port 13.

Since, of the supply channel 14, the vicinity of the supply port 13 is formed so as to be gradually wider toward the supply port (exit) 13, the force, of the liquid LQ supplied onto the substrate P (substrate stage PST), to the substrate is dispersed. Therefore, also in the embodiment shown in FIG. 9, a force of the supplied liquid LQ exerted on the substrate P can be suppressed.

It should be noted that the supply port 13 is desirably arranged near the inner side surface 79 in the case where the liquid LQ is supplied onto the substrate from above in the vertically downward direction as in this embodiment. By arranging the supply port 13 near the inner side surface 79, immixture of a gas can be prevented and remaining of a gas (bubble) in the space on the bottom surface 70A of the nozzle member 70 can be prevented, also in the case where the liquid LQ flows, onto the surface of the substrate P from above in the vertically downward direction.

It is to be noted that in the embodiment shown in FIG. 9, the trumpet-shaped supply port 13 supplies the liquid LQ from above the substrate P in vertically downward direction, but needless to say, the flow direction of the liquid LQ by the trumpet-like supply port 13 may be a direction along the XY-plane. More specifically, the shape of the vicinity of the supply port 12 of the supply channel 14 connected to the supply port 13 from that the liquid LQ flows substantially in parallel with the surface of the substrate P supported by the substrate stage PST may be formed so as to be gradually wider toward the supply port 13.

In addition, both of a supply port that supplies the liquid LQ from above the substrate P in the vertically downward direction as shown in FIG. 9 and a supply port from that the liquid LQ flows substantially in parallel with the substrate P as shown in FIG. 4 and FIG. 5 may be provided. In this case, it may be configured such that when the supply of the liquid LQ to the image plane side of the projection optical system PL is started, the liquid LQ flows from the supply port as shown in FIG. 4 and FIG. 5, and that after the image plane side of the projection optical system PL is filled with sufficient liquid LQ, the liquid LQ is supplied from the supply port as shown in FIG. 9. Alternatively, it may be configured such that when the supply of the liquid LQ to the image plane side of the projection optical system PL is started, the supply amount of the liquid LQ from the supply port as shown in FIG. 4 and FIG. 5 is larger than the supply amount of the liquid LQ from the supply port as shown in FIG. 9, and that after the image plane side of the projection optical system PL is filled with the sufficient liquid LQ, the supply amount of the liquid LQ from the supply port as shown in FIG. 9 is larger than the supply amount of the liquid LQ from the supply port as shown in FIG. 4 and FIG. 5.

Figure 10:
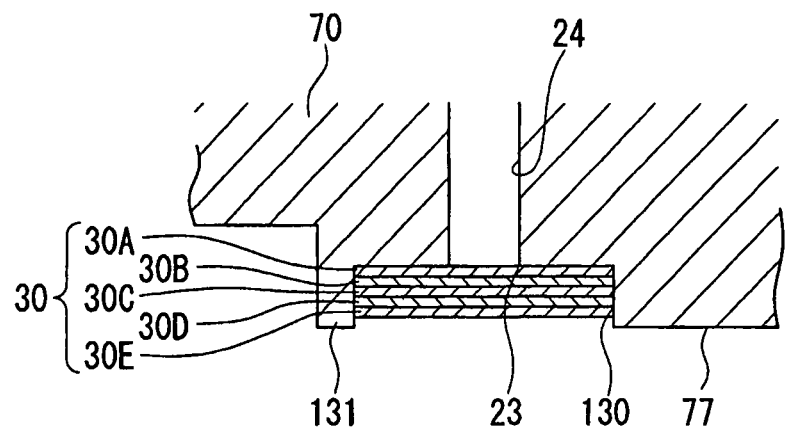
FIG. 10 is an enlarged view showing porous members provided over a recovery port.

FIG. 10, which shows another embodiment of the recovery port 23, is an enlarged sectional view of the recovery port 23 and the porous members 30 (30A to 30E) provided over the recovery port 23. In FIG. 10, a plurality of porous members 30A to 30E are arranged in a stack over the recovery port 23 that recovers the liquid LQ on the image plane of the projection optical system PL. In this embodiment, five porous members 30A to 30E are located in a stack. On the bottom surface 70A of the nozzle member 70, an annular wall portion 131 that protrudes toward the substrate P is provided farther away than the land surface 77 with respect to the projection region AR1, and an annular recess portion 130 is formed between the land surface 77 and the wall portion 131. Furthermore, the recovery port 23 is formed in the recess portion 130 in the bottom surface 70A of the nozzle member 70, and the porous members 30A to 30E are disposed so as to cover the recovery port 23.

Figure 11:
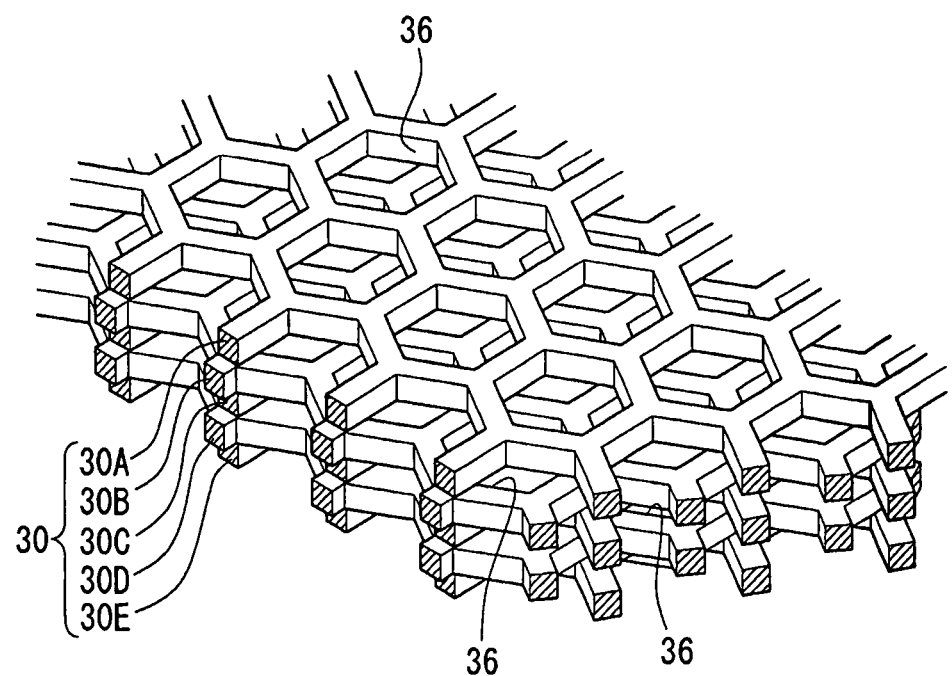
FIG. 11 is an enlarged view showing an embodiment of porous members.

FIG. 11 is an enlarged perspective view showing a plurality of (five) porous members 30A to 30E provided in a stack. As shown in FIG. 11, each of the porous members is a mesh member having a plurality of pores 36. Each of the porous members 30A to 30E shown in FIG. 11 is a mesh member in which a honeycomb pattern constituted by a plurality of substantially pentagonal pores 36 is formed. The plurality of the pores 36 formed in the plurality of porous members 30A to 30E, respectively, have substantially the same shape. Furthermore, the porous members 30A to 30E are stacked one on top of another over the recovery port 23 so that the positions of the pores 36 of the respective members are misaligned. It is to be noted that the porous member 30 shown in FIG. 11 has a thickness of about 100 μm; the pore 36 has a size of about 300 μm; and the distance between the adjacent pores 36 is about 100 μm.

By arranging the porous members 30A to 30E having the plurality of pores 36 over the recovery port 23, the liquid-drop size of the liquid LQ that has passed through the porous members 30A to 30E for recovery via the recovery port 23 can be made small. As described above, in this embodiment, the liquid LQ on the substrate P (substrate stage PST) is recovered from the recovery port 23 together with the gas therearound (as if to bite into the gas). The liquid LQ, turning into liquid drops through being recovered with the gas around it, passes through the recovery channel 24 and recovery pipe 22 in the liquid-drop state. Furthermore, it can be conceived that when passing through the recovery channel 24 and the recovery pipe 22, the liquid LQ in the liquid-drop state hits the inner walls of the recovery channel 24 and the recovery pipe 22, thus generating vibration. In such a case, if the liquid-drop size of the recovered liquid LQ is large, it is highly possible that vibration with a frequency band that could affect exposure accuracy and measurement accuracy will be generated. To be specific, if the liquid-drop size of the recovered liquid LQ is large, the main frequency band of the vibration generated has a relatively low value (low frequency), which affects exposure accuracy and measurement accuracy. On the other hand, if the main frequency band of the vibration generated has a relatively high value (high frequency), this can be addressed by passive vibration isolation, and thus it is conceived that its effect on exposure accuracy and measurement accuracy would be small.

Therefore, when the liquid LQ is recovered in the liquid-drop state, it is effective to make the liquid-drop size as small as possible in order to make the generated vibration a high frequency. Thus, by disposing the porous members 30 over the recovery port 23, the liquid LQ having passed through the pores 36 of the porous members 30 can be converted into small-sized liquid drops.

By the way, it is desirable that the size of the pores 36 be as small as possible in order to make the liquid-drop size of the liquid LQ as small as possible. The above-mentioned porous member is formed by making pores in a plate member that serves as a base material for the porous member constituted by stainless steel, etc. In terms of machining accuracy, it is preferable that the thickness of the plate member be thinner in order to make small pores. On the other hand, if the thickness of the porous member (plate member) is thin, sufficient strength is not obtained when it is disposed over the recovery port 23 (the recess portion 130). As a result, it is highly possible that when the liquid LQ is recovered, a disadvantage will occur that the porous member is deformed, damaged, etc. due to pressure difference generated between the top surface and bottom surface of the porous member.

Thus, by making the per-sheet thickness of the porous member thin, the size of the pore 36 can be machined small; and by providing the plurality of porous members 30A to 30E in a stack, the strength of the porous members 30 (30A to 30E) when provided over the recovery port 23 can be maintained.

Furthermore, when provided in a stack, the plurality of porous members 30A to 30E are stacked such that the positions of each of the pores 36 are misaligned. This enables the substantial size of the pores through which the liquid LQ passes to be small, and the liquid LQ that passes through the pores to be even smaller.

It is to be noted that, in this embodiment, the porous members 30 are formed of stainless steel, and the surface thereof is subjected to a treatment that forms a film of chromic oxide as a surface treatment. Moreover, in addition to the porous members 30, the nozzle member 70 may be formed of stainless steel, and at least a liquid contact surface of the nozzle member 70 may be subjected to the above-mentioned surface treatment. Alternatively, as a matter of course, it is possible that the members which come into contact with the liquid LQ such as the supply pipe 12 and the recovery pipe 22 are formed of stainless steel and subjected to the above-mentioned surface treatment.

Figure 12:
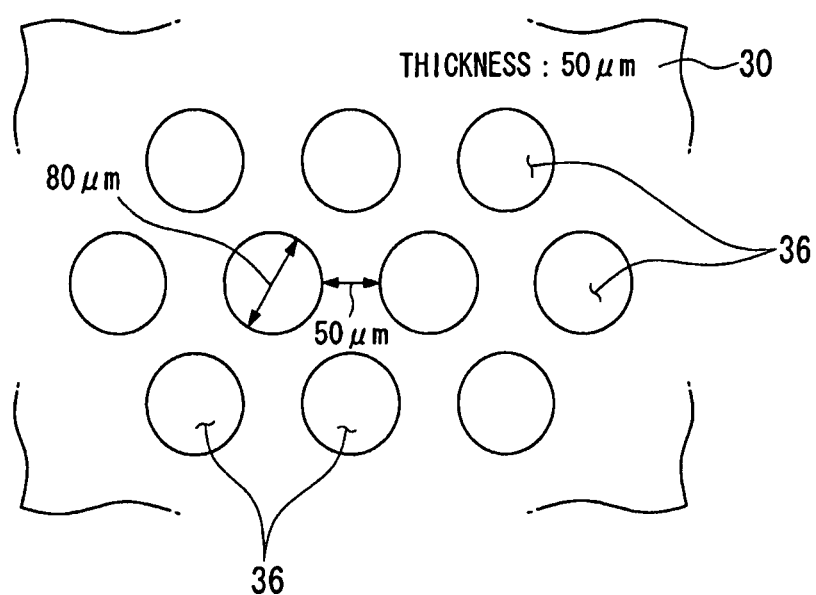
FIG. 12 is an enlarged view showing another embodiment of porous members.

It is to be noted that in this embodiment, the pores 36 are substantially pentagon-shaped, but needless to say, they can take any shape. For example, as shown in FIG. 12, the pores 36 may be circular, or may be any polygonal other than pentagonal. The porous member 30 shown in FIG. 12 has a thickness of about 50 μm; the pore 36 has a size of about 80 μm; and the distance between the adjacent pores 36 is about 50 μm.

In addition, when a plurality of porous members are disposed in a stack, shapes of the pores 36 formed in the plurality of porous members 30A to 30E may be different from one another; for example, the pores of a first porous member are circular, and the pores of a second porous member are pentagonal or rectangular.

In addition, when the porous members are provided in a stack, the size of the pores formed in a first porous member and the size of the pores formed in a second porous member may be different from each other. For example, a first porous member with pentagonal pores 36 having a first size and a second porous member with pentagonal pores 36 having a second size may be stacked.

In addition, while in the above-described embodiment, five porous members 30 are stacked, it is needless to say that any plural number thereof can be stacked. Furthermore, when a plurality of porous members in which the respective pores 36 are different in size and shape are stacked, the order of stacking can be appropriately changed.

Figure 13:
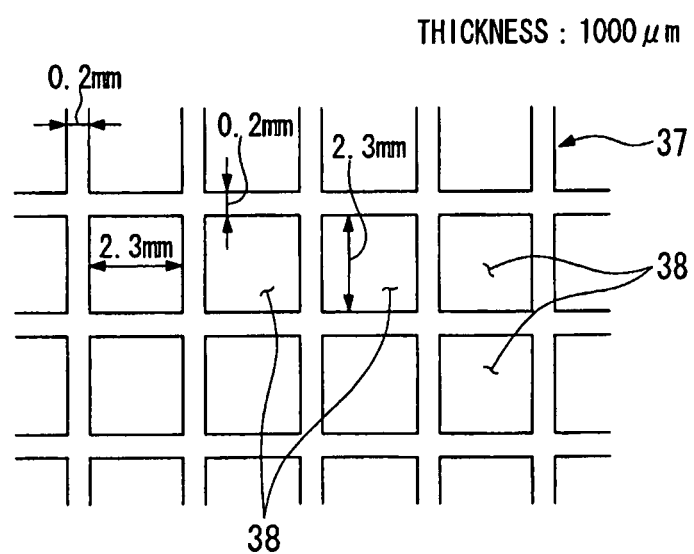
FIG. 13 is an enlarged view showing still another embodiment of porous members.

In addition, while in the above-described embodiment, a plurality of porous members 30 are stacked in which each of the members is, for example, a thin plate member having a thickness of about 100 μm with pores 36 having a diameter of about 100 μm, a grid-shaped member 37 having a plurality of rectangular-shaped pores 38 as shown in FIG. 13 may be provided so as to be sandwiched between any porous members 30 among the plurality of porous members 30 to be stacked. Here, the thickness of the grid-shaped member 37 is sufficiently thicker than the thickness of the porous member 30; it is set to, e.g., about 1000 μm. In addition, the size of the pores 38 of the grid-shaped member 37 is sufficiently larger than the size of the pores 36 of the porous member 30; for example, it is about 2.3 mm. In addition, the distance between the adjacent pores 38 is about 0.2 μm.

Thus, by providing a grid-shaped member 37 that has pores 38 with the size different from the size of the pores 36 of the porous members 30 and that is formed thicker than the porous member 30 in a stack with the porous members 30, overall strength of the stacked layers constituted by the porous members 30 and the grid-shaped member 37 can be further increased.

In addition, by stacking the porous members 30 having the pores 36 and the grid-shaped member 37 having the pores 38 different in size from the pores 36, the liquid-holding ability of the stacked body constituted by the porous members 30 and the grid-shaped member 37 can be improved. More specifically, by sandwiching the grid-shaped member 37 between any porous members 30 when a plurality of porous members 30 with the pores 36 are stacked, the liquid LQ is drawn in, by capillary action, between the porous members 30 that sandwich the grid-shaped member 37. Therefore, the liquid-holding ability of the stacked body can be improved.

With the liquid-retaining ability of the stacked body constituted by the porous members 30 and the grid-shaped member 37 being improved, the stacked body (the recovery port 23) can be prevented from drying up in a short time when disposed over the recovery port 23. Therefore, a disadvantage can be prevented that an adhesion trace (so-called water mark) of the liquid LQ is formed on the stacked body (recovery port 23). A water mark is formed by, after impurities are mixed into a liquid attached onto an object, vaporization of the liquid. When a water mark is formed, there is a possibility that disadvantages will occur such as the clogging of the pores 36 of the stacked body (porous members 30). In addition, once a water mark is formed in the stacked body (recovery port 23), there is also a possibility that disadvantages will occur such as that impurities due to the water mark are mixed into the liquid immersion region AR2 when the stacked body touches the liquid LQ in the liquid immersion region AR2, for example, during exposure. Thus, with the liquid-retaining ability of the stacked body being improved, once the stacked body is wet with the liquid LQ, formation of a water mark can be prevented without the necessity of always immersing the stacked body in the liquid LQ, because evaporation of the liquid LQ held in the stacked body is suppressed. Therefore, disadvantages can be prevented such as clogging of the stacked body (porous members 30) or mixing of impurities due to a water mark into, e.g., the liquid immersion region AR2.

It should be noted that, to improve the liquid-retaining ability of the stacked body, the thickness of the grid-shaped member 37 need not be thick compared with the thickness of the porous member 30 but may be equivalent to the thickness of the porous member 30. On the other hand, as described above, by making the thickness of the grid-shaped member 37 thicker, the strength of the stacked body can be improved.

As described above, the liquid LQ of this embodiment is constituted by purified water. Purified water has advantages in that it can be easily obtained in large quantity at semiconductor manufacturing plants, etc. and in that it has no adverse effects on the photoresist on the substrate P and on the optical elements (lenses), etc. In addition, purified water has no adverse effects on the environment and contains very few impurities. Thus, an action whereby the surface of the substrate P and the surface of the optical element provided on the tip end surface of the projection optical system PL are cleaned can also be expected. It is to be noted that in the case where the purity of the purified water supplied from plants, etc. is low, the exposure apparatus may be adapted to have an ultrapure water manufacturing device.

Furthermore, the index of refraction n of purified water (water) with respect to exposure light EL with a wavelength of about 193 nm is said to be nearly 1.44, and thus when an ArF excimer laser light (193 nm wavelength) is used as the light source of the exposure light EL, there is a possibility to shorten the wavelength to 1/n, that is, approximately 134 nm on the substrate P, to obtain high resolution. Moreover, the depth of focus is expanded by approximately n times, that is, approximately 1.44 times, compared with that in air. Therefore, when it would be permissible to ensure the same level of depth of focus as the case in which it is used in air, there is a possibility to further increase the numerical aperture of the projection optical system PL, and resolution improves on this point as well.

It is to be noted that when the liquid immersion method is used as described above, the numerical aperture NA of the projection optical system may become 0.9 to 1.3. When, in this manner, the numerical aperture NA of the projection optical system becomes large, random-polarized light conventionally used as the exposure light may, because of its polarization effect, adversely affect the imaging performance; thus, a polarized light illumination method is preferably used. In this case, it is preferable that by performing linearly polarized light illumination in which the longitudinal direction of the line pattern of the line-and-space pattern on the mask (reticle) is aligned with the polarization direction, a lot of diffraction lights from S polarization components (TE polarization components), i.e., diffraction light from the polarization components having the polarization direction in line with the longitudinal direction of the line pattern are emitted from the pattern of the mask (reticle). When the space between the projection optical system PL and the resist applied to the surface of the substrate P is filled with the liquid, the light transmittance at the resist surface of diffraction light from the S polarization components (TE polarization components), which contribute to the improvement of the contrast, is higher compared with the case where the space between the projection optical system PL and the resist applied to the surface of the substrate P is filled with the gas (air), a high imaging performance can be obtained even in the case where the numerical aperture NA of the projection optical system is over 1.0. In addition, a phase shift mask, an oblique entrance illumination method (in particular, the dipole illumination method), as disclosed in Japanese Unexamined Patent Application, First Publication No. H06-188169, which meets the longitudinal direction of the line pattern, etc. may be appropriately combined with the above configuration, which works more effectively. In particular, the combination of the linearly polarized light illumination method and the dipole illumination method works effectively in the case where periodic directions of the line-and-space pattern are limited to a predetermined single direction, or in the case where hole patterns are densely populated along a predetermined single direction. For example, in the case where a halftone phase shift mask (a pattern with a halfpitch of about 45 nm) with a light transmittance of 6% is exposed by concurrent used of the linearly polarized light illumination method and the dipole illumination method, the depth of focus (DOF) can be increased by about 150 nm compared with the use of random-polarized light, if illumination a defined by the circumcircle of the two light fluxes forming a dipole on the pupil surface of the illumination system is set to 0.95; the radius of each light flux on the pupil surface is set to 0.125σ; and the numerical aperture of the projection optical system PL is set as NA=1.2.

In addition, for example, when by using, for example, an ArF excimer laser light as the exposure light and using the projection optical system PL having a reduction magnification of about ¼, a fine line-and-space pattern (e.g., line-and-space of about 25 to 50 nm) is exposed onto the substrate P, depending on the structure of the mask M (e.g., the fineness of the pattern or the thickness of chrome), the mask M acts as a polarization plate due to the wave guide effect, and a higher amount of diffraction light from the S polarization components (TE polarization components) comes to be emitted from the mask M than the amount of diffraction light from the P polarization components (TM polarization components) which lower the contrast. In this case, the above-described linearly polarized light illumination is desirably employed, but also by illuminating the mask M with random-polarized light, a high resolution performance can be obtained even in the case where the numerical aperture NA of the projection optical system PL is large, e.g., 0.9 to 1.3.

In addition, when a very fine line-and-space pattern on the mask M is exposed onto the substrate P, there is a possibility that the emitted amount of diffraction light from the P polarization components (TM polarization components) becomes larger than the emitted amount of diffraction light from the S polarization components (TE polarization components) due to the wire grid effect. However, for example, when using an ArF excimer laser light as the exposure light and using the projection optical system PL having a reduction magnification of about ¼, a when a line-and-space pattern of more than 25 nm is exposed onto the substrate P, a higher amount of diffraction light from the S polarization components (TE polarization components) is emitted from the mask M than the amount of diffraction light from the P polarization components (TM polarization components). Therefore, a high resolution performance can be obtained even in the case where the numerical aperture NA of the projection optical system is large, e.g., 0.9 to 1.3.

Furthermore, not only the linearly polarized light illumination (S polarized light illumination) in which the longitudinal direction of the line pattern on the mask (reticle) is aligned with the polarization direction, but also the combination, as disclosed in Japanese Unexamined Patent Application, First Publication No. H06-53120, of the polarized light illumination method, in which the lights used are linearly polarized in the tangential (circumpherential) directions relative to a circle, the center of which is the optical axis, and an oblique entrance illumination method is effective. In particular, in the case where not only line patterns which extend in a predetermined single direction but also line patterns which extend in multiple different directions are included (line-and-space patterns with different periodic directions are included) in the pattern of the mask (reticle), by using, as also disclosed in Japanese Unexamined Patent Application, First Publication No. H06-53120, the polarized light illumination method, in which the lights used are linearly polarized in the tangential directions relative to a circle, the center of which is the optical axis, in combination with an orbicular zone illumination method, a high resolution performance can be obtained even in the case where the numerical aperture NA of the projection optical system is large. For example, in the case where a halftone phase shift mask (a pattern with a halfpitch of about 63 nm) with a light transmittance of 6% is exposed by using the linearly polarized light illumination method in which the lights used are linearly polarized in the tangential directions relative to a circle, the center of which is the optical axis, in combination with the orbicular zone illumination method (orbicular zone ratio of ¾), the depth of focus (DOF) can be increased by about 250 nm compared with the use of random-polarized light, if illumination σ is set to 0.95; and the numerical aperture of the projection optical system PL is set as NA=1.00. Furthermore, in the case of a pattern with a halfpitch of about 55 nm and the numerical aperture of the projection optical system NA=1.2, the depth of focus can be increased by about 100 nm.

In this embodiment, the optical element 2 is attached to the end of the projection optical system PL, and by this lens, the optical characteristics of the projection optical system PL, for example, aberration (spherical aberration, coma aberration, etc.) can be adjusted. It should be noted that as the optical element to be attached to the end of the projection optical system PL, an optical plate used for the adjustment of the optical characteristics of the projection optical system PL may be utilized. Alternatively, a plane parallel plate that can transmit the exposure light EL may be utilized.

It should be noted that in the case where the pressure, caused by the flow of the liquid LQ, in the space between the optical element located at the end of the projection optical system PL and the substrate P is high, it may be configured such that the optical element is rigidly fixed so as not to move due to the pressure, instead of making the optical element replaceable.

It should be noted that, in this embodiment, it is configured such that the space between the projection optical system PL and the surface of the substrate P is filled with the liquid LQ, but it may be configured, for example, such that the space is filled with the liquid LQ with a cover glass constituted by a plane parallel plate being attached to the surface of the substrate P.

It is to be noted that the liquid LQ of this embodiment is water, but it may be a liquid other than water. For example, when the light source of the exposure light EL is an $F_2$ laser, the $F_2$ laser light does not transmit through water. Therefore, as the liquid LQ, a fluorofluid that can transmit the $F_2$ laser light, such as perfluoropolyether (PFPE) or fluorochemical oil, may be used. In this case, the part to be in contact with the liquid LQ is subjected to lyophilic treatment by forming a thin film using a substance with a molecular structure that has a small polarity including fluorine. In addition, as the liquid LQ, a material (e.g., cedar oil) that can transmit the exposure light EL, has as high a refractive index as is practicable, and does not affect the projection optical system PL or the photoresist applied to the surface of the substrate P can also be used. Also in this case, the surface treatment is performed in accordance with the polarity of the liquid LQ to be used.

It is to be noted that, as for the substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer) for use in an exposure apparatus, etc. are used.

As for the exposure apparatus EX, a step-and-scan type exposure apparatus (scanning stepper) in which while synchronously moving the mask M and the substrate P, the pattern of the mask M is scan-exposed, and besides, a step-and-repeat type projection exposure apparatus (stepper) in which the pattern of the mask M is statically exposed with the mask M and substrate P being in a stationary state and in which the substrate P is successively moved stepwise can be used.

In addition, as for the exposure apparatus EX, an exposure apparatus in which with a first pattern and the substrate P being in a substantially stationary state, the reduction image of the first pattern is statically exposed by using a projection optical system (e.g., a refraction type projection optical system that has a reduction magnification of ⅛ and includes no reflecting element) can also be used. In this case, a stitch type exposure apparatus in which subsequently to the above static exposure of the first pattern, the reduction image of a second pattern is statically exposed onto the substrate P, with the second pattern and the substrate P being in a substantially stationary state, by using the projection optical system in a manner that the first pattern image and the second pattern image partially overlap each other can also be used. Furthermore, as for a stitch type exposure apparatus, a step-and-stitch type exposure apparatus in which at least two patterns are transferred onto the substrate P in a partially overlapping manner and in which the substrate P is successively moved can also be used.

In addition, the present invention can be applied also to a twin-stage type exposure apparatus as disclosed in Japanese Unexamined Patent Application, First Publication No. H10-163099, Japanese Unexamined Patent Application, First Publication No. H10-214783, Published Japanese Translation No. 2000-505958 of the PCT International Application, etc.

In addition, the present invention can be applied also to an exposure apparatus including: a substrate stage that holds a substrate; and a measurement stage mounted with a reference member in which a reference mark is formed and with various photoelectric sensors as disclosed in Japanese Unexamined Patent Application, First Publication No. H11-135400 or Japanese Unexamined Patent Application, First Publication No. 2000-164504.

The types of exposure apparatuses EX are not limited to exposure apparatuses for semiconductor element manufacture that expose a semiconductor element pattern onto a substrate P but can be widely applied also to exposure apparatuses for the manufacture of liquid crystal display elements or for the manufacture of displays, or exposure apparatuses for the manufacture of thin film magnetic heads, image pickup devices (CCDs), or reticles or masks.

In addition, in the above-described embodiments, a light-transmittance type mask in which a predetermined light-shielding pattern (or phase pattern/light-reducing pattern) is formed on a light-transmissive base material is used, but instead of this mask, an electronic mask, as disclosed in U.S. Pat. No. 6,778,257, that forms a transmittance pattern, a reflection pattern, or a light-emitting pattern in accordance with electronic data on a pattern to be exposed may be employed.

In addition, while in the above-described embodiments, while the substrate is exposed by projecting the pattern image onto the substrate by using the projection optical system PL, the present invention can be applied also to an exposure apparatus (lithography system) in which a line and space is exposed onto a substrate P by forming an interference fringe on the substrate P as disclosed in PCT International Publication No. 2001/035168. In this case, the projection optical system PL need not be used.

When using a linear motor (see U.S. Pat. No. 5,623,853 or U.S. Pat. No. 5,528,118) in the substrate stage PST or the mask stage MST, either an air-cushion type linear motor that uses an air bearing or a magnetic levitation type linear motor that uses a Lorentz force or reactance force may be used. In addition, the respective stages PST, MST may be the types that move along a guide or may be the guideless types in which a guide is not provided.

As the driving mechanism for the respective stages PST, MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to the stage PST or the stage MST, and the other unit is attached to the moving surface side of the stage PST or the stage MST.

A reaction force generated by the movement of the substrate stage PST may be, as described in Japanese Unexamined Patent Application, First Publication No. H08-166475 (U.S. Pat. No. 5,528,118), mechanically released to the floor (earth) by the use of a frame member so that the force does not transmit to the projection optical system PL.

A reaction force generated by the movement of the mask stage MST may be, as described in Japanese Unexamined Patent Application, First Publication No. H08-330224 (U.S. patent application Ser. No. 08/416,558), mechanically released to the floor (earth) by use of a frame member so that the force does not transmit to the projection optical system PL.

As described above, the exposure apparatus EX according to the embodiments of the present application is manufactured by assembling various subsystems, including each constituent element listed in the claims of the present application, in such a manner that predetermined mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling various subsystems into the exposure apparatus includes mechanical connections, electrical circuit wiring connections, and air pressure plumbing connections between the various subsystems. Needless to say, there is also a process where each of the various subsystems is assembled prior to the assembling of the exposure apparatus from the various subsystems. On completion of the process of assembling the various subsystems in the exposure apparatus, overall adjustment is performed to make sure that every accuracy is maintained in the exposure apparatus as a whole. Additionally, it is desirable to manufacture the exposure apparatus in a clean room, in which the temperature, purity, etc. are controlled.

Figure 14:
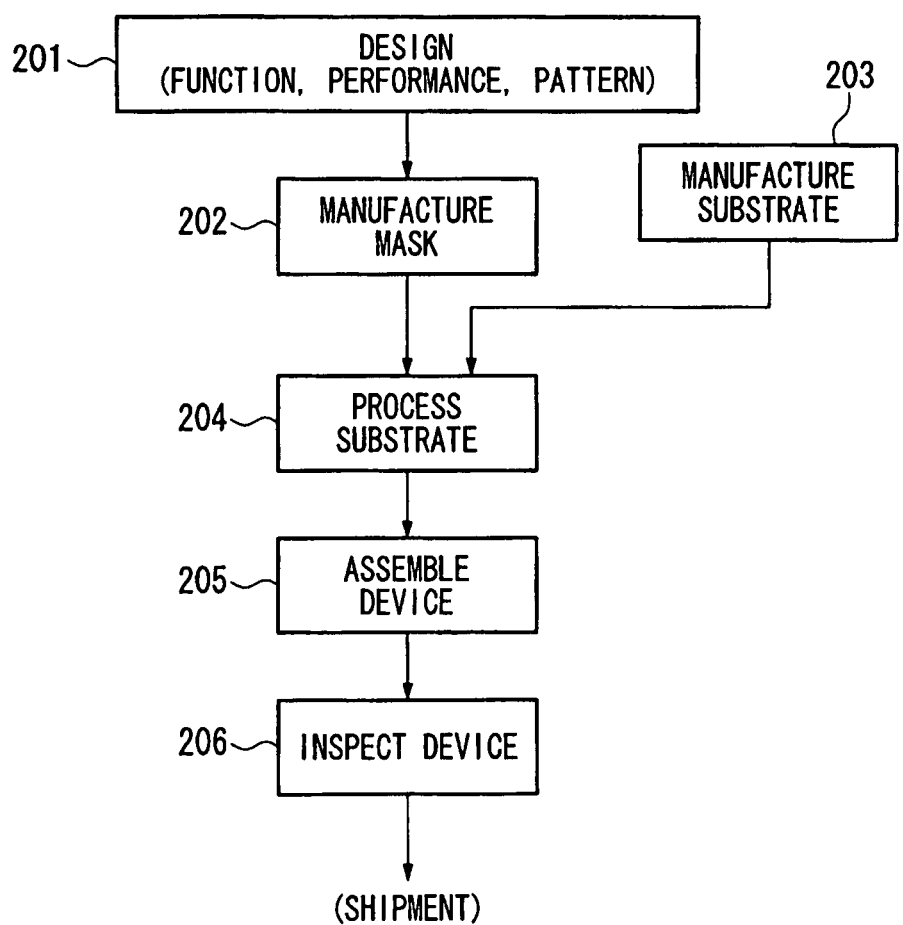
FIG. 14 is a flowchart showing an example of a semiconductor device manufacturing process.

As shown in FIG. 14, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate processing step 204 in which a pattern of the mask onto the substrate is exposed by the exposure apparatus EX according to the above-described embodiments; device assembly step 205 (including the dicing process, bonding process, and packaging process); and inspection step 206.

The invention claimed is:

1. An exposure apparatus that exposes a substrate by irradiating exposure light onto the substrate via a liquid, comprising:
a projection optical system having an optical member, the substrate being exposed to the exposure light from the optical member through the liquid between the optical member and the substrate;
a liquid recovery system having a recovery port, and
a plurality of porous members including a first porous member and a second porous member provided over the recovery port, each of the first and second porous members having a plurality of pores, and the pores of the first porous member being different from the pores of the second porous member in size,
wherein the liquid on the substrate is recovered into a recovery flow passage after passing through the pore of the first porous member and then passing through the pore of the second porous member.

2. The exposure apparatus according to claim 1, wherein at least one of the first and second porous members comprises a mesh member.

3. The exposure apparatus according to claim 1, wherein the pores of the first and second porous members have a similar shape, and
the first and second porous members are provided over the recovery port such that positions of the pores of the respective first and second porous members are misaligned.

4. The exposure apparatus according to claim 1, wherein the recovery port is provided so as to face the substrate located on the image plane side of the projection optical system and so as to surround a projection region of the projection optical system.

5. The exposure apparatus according to claim 4, wherein the liquid is supplied between the projection region of the projection optical system and the recovery port.

6. A device manufacturing method comprising:
exposing a substrate using the exposure apparatus of claim 1; and
processing the exposed substrate.

7. An exposure apparatus that exposes a substrate by irradiating exposure light onto the substrate via a liquid, comprising:
a projection optical system having an optical member, the substrate being exposed to the exposure light from the optical member through the liquid between the optical member and the substrate; and
a liquid immersion member disposed such that the liquid immersion member surrounds the optical member, the liquid immersion member being provided with a first porous member and a second porous member, each of the first and second porous members having a plurality of pores, and a size of the pores of the first porous member being different from a size of the pores of the second porous member, wherein the liquid between the first porous member and the substrate is sucked and recovered into a recovery flow passage after passing through the pore of the first porous member and then passing through the pore of the second porous member.

8. The exposure apparatus according to claim 7, wherein the liquid immersion member is provided with a recovery port over which the first and second porous members are provided.

9. The exposure apparatus according to claim 8, wherein the first and second porous members are provided in a stack over the recovery port.

10. The exposure apparatus according to claim 7, wherein the first and second porous members are provided in a stack.

11. The exposure apparatus according to claim 7, wherein a shape of the pores of the first porous member is similar to a shape of the pores of the second porous member.

12. The exposure apparatus according to claim 7, wherein a shape of the pores of the first porous member is different from a shape of the pores of the second porous member.

13. The exposure apparatus according to claim 7, wherein the liquid between the first porous member and the substrate is sucked and recovered with a gas.

14. The exposure apparatus according to claim 7, wherein the liquid immersion member has a lower surface provided such that the lower surface surrounds an optical path of the exposure light, the substrate being opposite to the lower surface of the liquid immersion member and the distance between the first porous member and the substrate is longer than the distance between the lower surface and the substrate.

15. The exposure apparatus according to claim 14, wherein the first porous member is provided further away from the optical path of the exposure light than the lower surface.

16. The exposure apparatus according to claim 14, wherein the first porous member is provided so as to surround the lower surface.

17. A device manufacturing method comprising:

exposing a substrate using the exposure apparatus of claim 7; and processing the exposed substrate.

18. A method used in an exposure apparatus, the method comprising:

exposing a substrate by irradiating exposure light onto the substrate via a liquid between an optical member of a projection optical system and the substrate; and recovering the liquid from on the substrate through pores of first and second porous members of a liquid immersion member which is disposed such that the liquid immersion member surrounds the optical member, a size of the pores of the first porous member being different from a size of the pores of the second porous member, wherein the liquid between the first porous member and the substrate is sucked and recovered into a recovery flow passage after passing through the pore of the first porous member and then passing through the pore of the second porous member.

19. The method according to claim 18, wherein the liquid immersion member is provided with a recovery port over which the first and second porous members are provided.

20. The method according to claim 19, wherein the first and second porous members are provided in a stack over the recovery port.

21. The method according to claim 18, wherein the first and second porous members are provided in a stack.

22. The method according to claim 18, wherein a shape of the pores of the first porous member is similar to the shape of the pores of the second porous member.

23. The method according to claim 18, wherein a shape of the pores of the first porous member is different from a shape of the pores of the second porous member.

24. The method according to claim 18, wherein the liquid between the first porous member and the substrate is sucked and recovered with a gas.

25. The method according to claim 18, wherein the liquid immersion member has a lower surface provided such that the surface surrounds an optical path of the exposure light, the substrate being opposite to the lower surface of the liquid immersion member and the distance between the first porous member and the substrate is longer than the distance between the lower surface and the substrate.

26. The method according to claim 25, wherein the first porous member is provided further away from the optical path of the exposure light than the lower surface.

27. The method according to claim 25, wherein the first porous member is provided so as to surround the lower surface.

* * * * *